(12) United States Patent
Biagini et al.

(10) Patent No.: US 10,465,073 B2
(45) Date of Patent: Nov. 5, 2019

(54) ORGANIC DYE FOR DYE-SENSITIZED SOLAR CELL

(71) Applicants: ENI S.p.A., Rome (IT); CNRS (CENTRE NATIONAL DE LA RECHERCHE SCIENTIFIQUE), Paris (FR)

(72) Inventors: Paolo Biagini, San Giuliano Terme (IT); Riccardo Po', Novara (IT); Jean Roncali, La Fleche (FR); Dora Demeter, Angers (FR)

(73) Assignees: ENI S.p.A., Rome (IT); CNRS (CENTRE NATIONAL DE LA RECHERCHE SCIENTIFIQUE), Paris (FR)

( * ) Notice: Subject to any disclaimer, the term of this patent is extended or adjusted under 35 U.S.C. 154(b) by 424 days.

(21) Appl. No.: 15/036,277

(22) PCT Filed: Nov. 14, 2014

(86) PCT No.: PCT/IB2014/066038
§ 371 (c)(1),
(2) Date: May 12, 2016

(87) PCT Pub. No.: WO2015/071864
PCT Pub. Date: May 21, 2015

(65) Prior Publication Data
US 2016/0264782 A1 Sep. 15, 2016

(30) Foreign Application Priority Data
Nov. 15, 2013 (IT) .............................. MI2013A1899

(51) Int. Cl.
*C09B 23/10* (2006.01)
*C09B 57/00* (2006.01)
*H01L 51/00* (2006.01)
*H01G 9/20* (2006.01)

(52) U.S. Cl.
CPC .......... *C09B 23/102* (2013.01); *C09B 23/105* (2013.01); *C09B 57/00* (2013.01); *H01G 9/2027* (2013.01); *H01G 9/2059* (2013.01); *H01G 9/2063* (2013.01); *H01L 51/0037* (2013.01); *H01L 51/0064* (2013.01); *Y02E 10/542* (2013.01); *Y02E 10/549* (2013.01)

(58) Field of Classification Search
CPC ..... C09B 23/102; C09B 23/105; C09B 57/00; H01L 51/0037; H01L 51/0064; H01G 9/2059; H01G 9/2027; H01G 9/2063; Y02E 10/542; Y02E 10/549

See application file for complete search history.

(56) References Cited

U.S. PATENT DOCUMENTS

| | | | |
|---|---|---|---|
| 2010/0292488 A1 | 11/2010 | Tung et al. | |
| 2011/0094588 A1* | 4/2011 | Lee ..................... | C09B 23/0008 136/263 |
| 2013/0144069 A1 | 6/2013 | Tung et al. | |
| 2013/0160855 A1 | 6/2013 | Gibson et al. | |

FOREIGN PATENT DOCUMENTS

| | | | | |
|---|---|---|---|---|
| CN | 101407639 A | | 4/2009 | |
| EP | 2 341 107 A2 | | 7/2011 | |
| EP | 2738864 | * | 2/2013 | ............ H01M 14/00 |
| WO | WO 2012/001033 A1 | | 1/2012 | |
| WO | WO 2013/160201 A1 | | 10/2013 | |

OTHER PUBLICATIONS

Cai et al. Engineering of Push-Pull Thiophene Dyes to Enhance Light Absorption and Modulate Charge Recombination in Mesoscopic Solar Cells. Adv. Funct. Mater. 2013, 23, 1846-1854.*
International Search Report dated Feb. 23, 2015 in PCT/IB2014/066038.
Chun-Guey Wu, et al., "Supporting Information Fluorene-Containing Organic Photosensitizers for Dye-Sensitized Solar Cells" Chempluschem, http://onlinelibrary.wiley.com/store/10.1002/cplu.201200127/asset/supinfo/cplu_201200127_sm_miscellaneous_information.pdf, XP055134249, Jul. 9, 2012, 23 Pages.
Ning Cai, et al., "Engineering of Push-Pull Thiophene Dyes to Enhance Light Absorption and Modulate Charge Recombination in Mesoscopic Solar Cells" Advanced Functional Materials, vol. 23, No. 14, XP001582431, Apr. 12, 2013 pp. 1846-1854.
Anders Hagfeldt, et al., "Dye-Sensitized Solar Cells" Chemical Reviews, vol. 110, No. 11, XP055029250, Nov. 10, 2010, pp. 6595-6663.
Amaresh Mishra, et al., "Metal-Free Organic Dyes for Dye-Sensitized Solar Cells: From Structure: Property Relationships to Design Rules" Angewandte Chemie International Edition, vol. 48, No. 14, XP055044815, Mar. 23, 2009, pp. 2474-2499.

* cited by examiner

*Primary Examiner* — Amina S Khan
(74) *Attorney, Agent, or Firm* — Oblon, McClelland, Maier & Neustadt, L.L.P.

(57) ABSTRACT

An organic dye for a dye-sensitized solar cell (DSSC) comprising at least one electron-acceptor unit and at least one π-conjugated unit is described. Said organic dye is particularly useful in a dye-sensitized photoelectric transformation element which, in its turn, can be used in a dye-sensitized solar cell (DSSC).

10 Claims, No Drawings

ORGANIC DYE FOR DYE-SENSITIZED SOLAR CELL

The present invention relates to an organic dye for a dye-sensitized solar cell (DSSC).

More in particular, the present invention relates to an organic dye for a dye-sensitized solar cell (DSSC) comprising at least one electron-acceptor unit and at least one π-conjugated unit.

Said organic dye is particularly useful in a dye-sensitized photoelectric transformation element which, in its turn, can be used in a dye-sensitized solar cell (DSSC).

Consequently, it is a further object of the present invention a dye-sensitized photoelectric transformation element comprising the organic dye above reported, as well as a dye-sensitized solar cell (DSSC) comprising said photoelectric transformation element.

Dye-sensitized solar cells (DSSCs) have been developed by Gratzel et al. on 1991 and they have attracted considerable attention in recent years due to their high efficiency and remarkably low manufacture cost compared to the existing silicon solar cells. Further details about dye-sensitized solar cells (DSSCs) can be found, for example, in: Kalyanasundaram K., "*Dye-Sensitized Solar Cells*" (2010), CRC Press Inc., 1$^a$ Edizione; Elliott C. M., "*Nature Chemistry*" (2011), Vol. 3, pg. 188-189; Hagfeldt A. et al., "*Chemical Reviews*" (2010), Vol. 110, pg. 6595-6663; Grätzel M., "*Nature*" (2001), Vol. 414, pg. 338-344.

The dye-sensitized solar cells (DSSCs) are photoelectrochemical solar cells mainly comprising organic dye molecules capable of absorbing visible light to generate electron-hole pair, and transition metal oxide for transmitting the generated electrons.

As organic dyes for dye-sensitized solar cells (DSSCs), ruthenium metal complexes which show high photoelectric transformation efficiency has been widely used. However, in spite of more recent progresses (see, for example, Abbotto A. et al., "*Dalton Transaction*" (2011), Vol. 40, pg. 12421-12438), ruthenium metal complexes contain expensive ruthenium metal and usually require careful synthesis and tricky purification steps.

Recently, it has been found that metal-free organic dyes which show excellent properties in terms of absorption efficiency, oxidation reduction stability and intramolecular charge-transfer (CT) absorption, may be used for dye-sensitized solar cells (DSSCs) as an alternative of expensive ruthenium metal complexes.

Metal-free organic dyes, generally, comprise electron donor unit-electron acceptor unit connected by π-conjugated unit. For most metal-free organic dyes, arylamine derivatives function as electron-donor unit and cyanoacrylic acid or rodhanine residue functions as electron acceptor unit, and they are connected by π-conjugated unit such as, for example, methanine unit or thiophene chain.

A lot of studies have been carried out with regard to said metal-free organic dyes.

For example, Tan S. et al. in the article "Novel Carboxylated Oligothiophenes as Sensitizers in Photoelectric Conversion Systems", *Chemistry—A European Journal* (2005), Vol. 11, Issue 21, pg. 6272-6276, disclose novel carboxylated oligothiophenes with different thiophene units as photosensitisers in dye-sensitized solar cells (DSSCs). It is said that the introduction of —COOH group into thiophene molecules may led to a red shift of UV-visible absorption, increase light-harvesting efficiency and enhance photoinduced charge transport by forming efficient covalent bonds to the substrate surface. It is also said that the dye-sensitized solar cells (DSSCs) based on said oligothiophenes have excellent performances: in particular, under irradiation of 100 mW·cm$^{-2}$ a short-circuit current of 10.57 mA·cm$^{-2}$ and an overall photoelectric transformation efficiency (η) of 3.36% is achieved, when pentathiophene dicarboxylated acid was used as a sensitizer.

Tanaka K. et al. in the article "Development and Photovoltaic Performance of Oligothiophene-sensitized TiO$_2$ Solar Cells", *Chemistry Letters* (2006), Vol. 35, No. 6, pg. 592-593, disclose novel dye-sensitized TiO$_2$ solar cells using a variety of oligothiophenecarboxylic acids. It is said that said solar cells show relatively high photovoltaic performances, i.e. a photoelectric transformation efficiency (η) ranging from 0.41% to 1.29%, which are largely dependent on the chain lengths of the oligothiophenes and on the number of the carboxylic groups.

Mishra A. et al. in the review "Metal-Free Organic Dyes for Dye-Sensitized Solar Cells: From Structure: Property Relationships to Design Rules", *Angewandte Chemie* (2009), Vol. 48, pg. 2474-2499, disclose recent advances in molecular design and technological aspects of metal-free organic dyes for application in dye-sensitized solar cells (DSSCs). Special attention has been paid to the design principles of this organic dyes and on the effect of various electrolyte systems. Co-sensitization, an emerging technique to extend the absorption range, is also discussed as a way to improve the performance of the device. In addition, inverted organic dyes for photocatode are also described, which constitute a relatively new approach for the production of tandem cells. Moreover, special consideration has been paid to the correlation between the molecular structure and the physical properties of the metal-free organic dyes with regard to their performances in dye-sensitized solar cells (DSSCs).

Yang H. et al. in the article "Organic Dyes Incorporating the Dithieno[3,2-b:2',3'-d]thiophene Moiety for Efficient Dye-Sensitized Solar Cells", *Organic Letters* (2010), Vol. 12, No. 1, pg. 16-19, disclose new dipolar compounds incorporating dithieno[3,2-b:2',3'-d]thiophene unit as the electron-donor, an oligothiophene as the conjugated spacer and 2-cyanoacrylic acid as the electron acceptor. These non-arylamine type metal-free organic compounds are said to be successfully used as the sensitizers of dye-sensitized solar cells (DSSCs): in particular, under AM 1.5 G irradiation the photoelectric transformation efficiency (η) ranges from of 3.54% to 5.15%.

Sahu D. et al. in the article "Synthesis and applications of novel acceptor-donor-acceptor organic dyes with dithienopyrrole- and fluorene-cores for dye-sensitized solar cells", *Tetrahedron* (2011), Vol. 67, No. 2, pg. 303-311, disclose new symmetrical organic dyes including a fluorene or a dithienopyrrole unit as electron donor, an oligothiophene as the conjugated spacer and two 2-cyanoacrylic acid groups as the electron acceptor. It is said that the dye-sensitized solar cells (DSSCs) comprising said organic dyes, in particular in the case of dyes including a fluorene unit, have a photoelectric transformation efficiency (η) of 4.73% under irradiation of 100 mW·cm$^{-2}$ and a maximum incident photon conversion efficiency (IPCE) of about 76% under AM 1.5 simulated solar irradiance.

However, most of the organic dyes already known may exhibit low photoelectric transformation efficiency (η) compared to ruthenium metal complex dyes. Therefore, there have been continuous attempts to develop novel organic dyes able to give dye-sensitized solar cells (DSSCs) having improved photoelectric transformation efficiency (η) compared to the existing organic dyes.

The Applicant has faced the problem of finding an organic dye able to give dye-sensitized solar cells (DSSCs) having improved photoelectric transformation efficiency (η), i.e. a photoelectric transformation efficiency (η) higher than or equal to 7.5%.

The Applicant has found an organic dye comprising at least one electron-acceptor group and at least one π-conjugated unit which is able to give a dye-sensitized solar cell (DSSC) having improved photoelectric transformation efficiency (η), i.e. a photoelectric transformation efficiency (ii) higher than or equal to 7.5%. Moreover, said dye-sensitized solar cells (DSSCs) also have improved Voc (open circuit photovoltage), FF (fill factor) and Jsc (short-circuit photocurrent density).

An object of the present invention therefore relates to an organic dye having general formula (I):

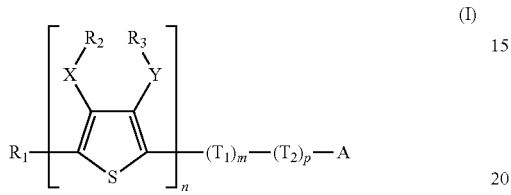

(I)

wherein:

T$_1$ and T$_2$, equal to or different from each other, are selected from a thiophenyl group of general formula (II), a 2,2'-bithiophenyl group of general formula (III), a 2,2':5',2''-terthiophenyl group of general formula (IV):

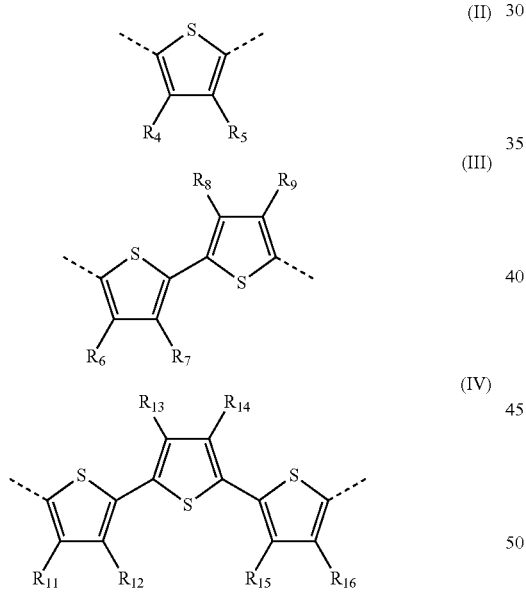

A is selected from: —COOH group, phosphonic groups having formula —PO(OH)$_2$ or —PO(OH)(R) wherein R represents a C$_1$-C$_{20}$, preferably C$_2$-C$_8$, alkyl group, linear or branched, carboxycyanovinylene groups having general formula (V), (VI), (VII), (VIII), (IX), (X), (XI), (XII), (XIII):

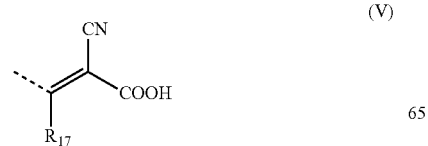

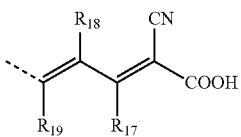

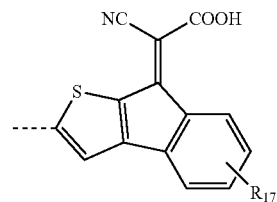

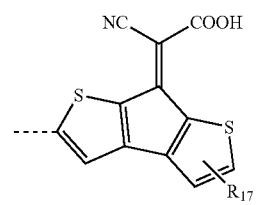

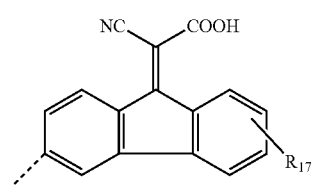

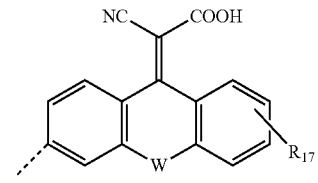

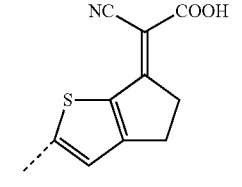

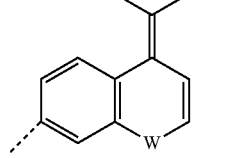

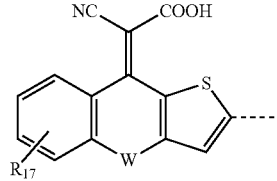

wherein R$_{17}$, R$_{18}$ and R$_{19}$, equal to or different from each other, represent a hydrogen atom, or are selected from C$_1$-C$_{20}$, preferably C$_2$-C$_8$, alkyl groups, linear or branched and W represents an oxygen atom or a sulphur atom;

$R_1$ represents a hydrogen atom; or is selected from: $C_1$-$C_{20}$, preferably $C_4$-$C_{12}$, alkyl groups, linear or branched, saturated or unsaturated, optionally containing heteroatoms, $C_4$-$C_{12}$, preferably $C_4$-$C_8$, cycloalkyl groups optionally substituted, $C_6$-$C_{24}$, preferably $C_6$-$C_{14}$, aryl groups optionally substituted, alkoxyl or aryloxyl groups optionally substituted, thioalkoxyl or thioaryloxyl groups optionally substituted, trialkyl- or triaryl-silyl groups optionally substituted, polyethyleneoxylic groups having general formula R'—O—[—$CH_2$—$CH_2$—O—]$_q$- wherein R' represents a hydrogen atom, or is selected from $C_1$-$C_{20}$, preferably $C_1$-$C_{12}$, alkyl groups, linear or branched, and q is an integer ranging from 1 to 20, preferably ranging from 2 to 10;

$R_2$ and $R_3$, equal to or different from each other, are selected from: $C_1$-$C_{20}$, preferably $C_2$-$C_8$, alkyl groups, linear or branched, saturated or unsaturated, optionally containing heteroatoms, $C_4$-$C_{12}$, preferably $C_4$-$C_8$, cycloalkyl groups optionally substituted, $C_6$-$C_{24}$, preferably $C_6$-$C_{14}$, aryl groups optionally substituted, polyethyleneoxylic groups having general formula R'—[O—$CH_2$—$CH_2$—]$_q$— wherein R' represents a hydrogen atom, or is selected from $C_1$-$C_{20}$, preferably $C_1$-$C_{12}$, alkyl groups, linear or branched, and q is an integer ranging from 1 to 20, preferably ranging from 2 to 10;

or, $R_2$ and $R_3$, can be optionally bound to each other to form, together with the other atoms to which they are bound, a saturated, unsaturated or aromatic, cycle containing from 1 to 12, preferably from 2 to 6, carbon atoms, optionally substituted with: $C_1$-$C_{20}$, preferably $C_2$-$C_8$, alkyl groups, linear or branched, saturated or unsaturated, optionally containing heteroatoms, $C_6$-$C_{24}$, preferably $C_6$-$C_{14}$, aryl groups optionally substituted, $C_4$-$C_{12}$, preferably $C_4$-$C_8$, cycloalkyl groups optionally substituted, halogen atoms such as, for example, fluorine, chlorine, bromine, iodine, preferably fluorine, cyano groups, nitro groups; said cycle optionally containing other heteroatoms such as, for example, oxygen, sulphur, nitrogen, silicon, phosphorous, selenium, boron;

$R_4$, $R_5$, $R_6$, $R_7$, $R_8$, $R_9$, $R_{10}$, $R_{11}$, $R_{12}$, $R_{13}$, $R_{14}$, $R_{15}$ and $R_{16}$, equal to or different from each other, represent a hydrogen atom; or are selected from: $C_1$-$C_{20}$, preferably $C_2$-$C_{12}$, alkyl groups, linear or branched, saturated or unsaturated, optionally containing heteroatoms, $C_4$-$C_{30}$, preferably $C_5$-$C_{20}$, cycloalkyl groups optionally substituted, $C_6$-$C_{36}$, preferably $C_6$-$C_{20}$, aryl groups optionally substituted, trialkyl- or triaryl-silyl groups optionally substituted;

X and Y, equal to or different from each other, represent an heteroatom such as, for example, oxygen, sulphur, selenium, tellurium, preferably oxygen or sulphur;

n is an integer ranging from 1 to 3, preferably is 1;

m and p, equal to or different from each other, are an integer ranging from 0 to 12, preferably ranging from 0 to 5, with the proviso that m+p is equal to or higher than 1, preferably is higher than 2.

For the aim of the present description and of the following claims, the definitions of the numerical ranges always comprise the extremes unless otherwise specified.

For the aim of the present description and of the following claims, the term "comprising" also includes the terms "which essentially consists of" or "which consists of".

In accordance with a preferred embodiment of the present invention, in said general formula (I):

A is a carboxycyanovinylene group having general formula (V):

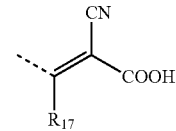

(V)

wherein $R_{17}$ represents a hydrogen atom;

$T_1$ is a thiophenyl group of general formula (II):

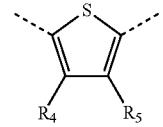

(II)

wherein $R_4$ and $R_5$ equal to or different from each other, represent a hydrogen atom; or are selected from $C_1$-$C_{20}$, linear or branched, saturated or unsaturated; preferably are a hydrogen atom;

$T_2$ is a 2,2':5',2"-terthiophenyl group of general formula (IV):

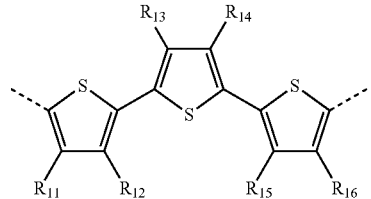

(IV)

wherein $R_{11}$, $R_{13}$, $R_{14}$ and $R_{16}$, equal to or different from each other, represent a hydrogen atom; or are selected from $C_1$-$C_{20}$, linear or branched, saturated or unsaturated; preferably are a hydrogen atom; $R_{12}$ and $R_{15}$, equal to or different from each other, are selected from $C_1$-$C_{20}$, linear or branched, saturated or unsaturated; preferably are a n-hexyl group;

$R_1$ is a hydrogen atom; or is selected from $C_1$-$C_{20}$ alkyl groups, linear or branched, saturated or unsaturated; preferably is a hydrogen atom or a n-hexyl group;

$R_2$ and $R_3$ are bound to each other to form, together with the other atoms to which they are bound, a saturated cycle containing 4 carbon atoms and two heteroatoms, said heteroatoms preferably being oxygen or sulphur;

X and Y, equal to each other, represent oxygen or sulphur;

n is 1;

m is 0 or 1;

p is 0 or 1, ed m+p is 1 or 2.

The term "$C_1$-$C_{20}$ alkyl groups" means linear or branched alkyl groups having from 1 to 20 carbon atoms, saturated or unsaturated. Specific examples of $C_1$-$C_{20}$ alkyl groups are: methyl, ethyl, n-propyl, iso-propyl, n-butyl, iso-butyl, t-butyl, n-pentyl, n-hexyl, n-heptyl, n-octyl, n-decyl, n-dodecyl, 2-ethylheptyl, 2-ethylhexyl, 2-butenyl, 2-pentenyl, 2-ethyl-3-hexenyl, 3-octenyl, 1-methyl-4-hexenyl, 2-butyl-3-hexenyl.

The term "$C_1$-$C_{20}$ alkyl groups optionally containing heteroatoms" means linear or branched alkyl groups having from 1 to 20 carbon atoms, wherein at least one of the hydrogen atoms is substituted by a heteroatom selected from: halogens such as, for example, fluorine, chlorine, bromine, preferably fluorine; nitrogen; sulfur; oxygen. Specific examples of $C_1$-$C_{20}$ alkyl groups optionally containing heteroatoms are: fluoromethyl, difluoromethyl, trifluoromethyl, trichloromethyl, 2,2,2-trifluoroethyl, 2,2,2-trichloroethyl, 2,2,3,3-tetrafluoropropyl, 2,2,3,3,3-pentafluoropropyl, perfluoropentyl, perfluorooctyl, perfluorodecyl, oxymethyl, thiomethyl, thioethyl.

The term "$C_4$-$C_{12}$ cycloalkyl groups" means cycloalkyl groups having from 4 to 12 carbon atoms. Said cycloalkyl groups can be optionally substituted with one or more groups, the same or different from each other, selected from: halogen atoms; hydroxyl groups; $C_1$-$C_{12}$ alkyl groups; $C_1$-$C_{12}$ alkoxyl groups; cyano groups; amino groups; nitro groups. Specific examples of cycloalkyl groups are: cyclopropyl, 2,2-difluorocyclopropyl, cyclobutyl, cyclopentyl, cyclohexyl, methylcyclohexyl, methoxycyclohexyl, fluorocyclohexyl, phenylcyclohexyl, decalin, abiethyl.

The term "$C_6$-$C_{24}$ aryl groups" means aromatic carbocyclic groups. Said aryl groups can be optionally substituted with one or more groups, the same or different from each other, selected from: halogen atoms such as, for example, fluorine, chlorine, bromine, preferably fluorine; hydroxyl groups; $C_1$-$C_{12}$ alkyl groups; $C_1$-$C_{12}$ alkoxyl groups; cyano groups; amino groups; nitro groups. Specific examples of aryl groups are: phenyl, methylphenyl, trimethylphenyl, methoxyphenyl, hydroxyphenyl, phenyloxyphenyl, fluorophenyl, pentafluorophenyl, chlorophenyl, bromophenyl, nitrophenyl, dimethylaminophenyl, naphthyl, phenylnaphthyl, phenanthrene, anthracene.

The term "trialkyl- or triaryl-silyl groups" means silane groups containing three $C_1$-$C_{20}$ alkyl groups, or three $C_6$-$C_{40}$ aryl groups. Said trialkyl- or triaryl-silyl groups can be optionally substituted with one or more groups, the same or different from each other, selected from: halogen atoms; hydroxyl groups; $C_1$-$C_{12}$ alkyl groups; $C_1$-$C_{12}$ alkoxyl groups; cyano groups; amino groups; nitro groups. Specific examples of trialkyl- or triaryl-silyl groups are: trimethylsilyl, triethyl-silyl, trihexyl-silyl, tridodecyl-silyl, dimethyldodecyl-silyl, triphenyl-silyl, methyldiphenyl-silyl, dimethylnaphthyl-silyl.

The term "alkoxyl or aryloxyl groups" means groups having an oxygen atom attached to a $C_1$-$C_{20}$ alkyl group or to a $C_6$-$C_{24}$ aryl group. Said alkoxyl or aryloxyl groups can be optionally substituted with one or more groups, the same or different from each other, selected from: halogen atoms; hydroxyl groups; $C_1$-$C_{12}$ alkyl groups; $C_1$-$C_{12}$ alkoxyl groups; cyano groups; amino groups; nitro groups. Specific examples of alkoxyl or aryloxyl groups are: methoxyl, ethoxyl, propoxyl, butoxyl, iso-butoxyl, 2-ethylhexyloxyl, phenoxyl, benzyloxyl, naphthyloxyl.

The term "thioalkoxyl or thioaryloxyl groups" means groups having an oxygen atom and a sulfur atom attached to a $C_1$-$C_{20}$ alkyl group or to a $C_6$-$C_{24}$ aryl group. Said thioalkoxyl or thioaryloxyl groups can be optionally substituted with one or more groups, the same or different from each other, selected from: halogen atoms; hydroxyl groups; $C_1$-$C_{12}$ alkyl groups; $C_1$-$C_{12}$ alkoxyl groups; cyano groups; amino groups; nitro groups. Specific examples of thioalkoxyl or thioaryloxyl groups are: thiomethoxyl, thioethoxyl, thiopropoxyl, thiobutoxyl, thio-iso-butoxyl, 2-ethylthiohexyloxyl, thiophenoxyl, thiobenzyloxyl.

The term "cyclo" means a system containing a ring containing from 3 to 12 carbon atoms, optionally containing heteroatoms selected from nitrogen, oxygen, sulfur, silicon, selenium, phosphorus. Specific examples of cyclo are: toluene, benzonitrile, cycloheptatriene, cyclooctadiene, pyridine, thiadiazole, pyrrole, thiophene, selenophene, t-butylpyridine, 1,4-dioxane.

The organic dye having general formula (I) may be prepared by processes known in the art, for example, by the nickel-catalyzed cross-coupling reaction of Grignard reagent of alkyl bromothiophene and α-α'-dibromo-oligothiophenes, such as described, for example, by Krömer J. et al. in the article "Homologous series of regioregular alkyl-substituted oligothiophenes up to an 11-mer", *Tetrahedron* (2001), Vol. 57, pg. 3785-3794; or by the Vilsmaier-Heck formilation of thiophene groups, such as described, for example, by Roquet S. et al. in the article "Triphenylamine-Thienylenevinylene Hybrid Systems with Internal Charge Transfer as Donor Materials for Heterojunction Solar Cells", *Journal of American Chemical Society* (2006), Vol. 128, No. 10, pg. 3459-3466; or by the reaction of formil derivatives with cyanoacetic acid such as described, for example, by Mikroyannidis J. A. et al. in the article "Triphenylamine- and benzothiadiazole-based dyes with multiple acceptors for application in dye-sensitized solar cells", *Journal of Power Sources* (2010), Vol. 195, Issue 9, pg. 3002-3010.

According to a further aspect, the present invention also relates to a dye-sensitized photoelectric transformation element comprising at least one organic dye having general formula (I), said dye-sensitized photoelectric transformation element being supported on oxide semiconductor particles.

The photoelectric transformation element according to the present invention may be prepared by a process for preparing a dye-sensitized photoelectric transformation element for dye-sensitized solar cells (DSSCs) of the prior art, except of using the organic dye having general formula (I).

Preferably, the photoelectric transformation element according to the present invention, is prepared by forming oxide semiconductor thin film on a substrate and subsequently supporting the organic dye having general formula (I) on the thin film.

The substrate on which the oxide semiconductor thin film is formed preferably has a conductive surface, and is commercially available. Preferably, said substrate may be selected, for example, from: glass; transparent polymers such as, for example, polyethyleneterephthalate, polyethersulfone, or mixtures thereof. Preferably, said substrate may have conductivity lower than or equal to 1000Ω, more preferably lower than or equal to 100Ω.

As the oxide semiconductor particles, metal oxide is preferable. Preferably, said oxide semiconductor may be selected, for example, from: titanium dioxide, tin oxide, zinc oxide, tungsten oxide, zirconium oxide, gallium oxide, indium oxide, yttrium oxide, niobium oxide, tantalum oxide, vanadium oxide, or mixtures thereof. More preferably, titanium dioxide, tin oxide, zinc oxide, niobium oxide, indium oxide, or mixtures thereof, may be used, titanium dioxide, zinc oxide, or tin oxide, or mixtures thereof, may be even more preferable, and titanium dioxide may be most preferable.

The oxide semiconductor particles may preferably have an average diameter ranging from 1 nm to 500 nm, more preferably ranging from 1 nm to 100 nm, and those having large diameter and those having small diameter may be mixed, or used in multi-layers.

The oxide semiconductor thin film may be prepared by means of different know techniques such as, for example: by spraying oxide semiconductor particles to form a thin film thereof directly on a substrate; by electrically depositing a semiconductor particle thin film using a substrate as an electrode; by applying semiconductor particle slurry or paste containing particles obtained by hydrolysis of suitable precursors such as a metal halogenide or a metal alkoxide, on a substrate ("doctor-blade" technique), and drying, curing or sintering. Preferably, paste may be applied on a substrate, and in this case, slurry may be obtained by dispersing semiconductor oxide particles, with particle diameter ranging from 1 nm to 200 nm, in a dispersion medium by a method known in the art.

As the dispersion medium, those capable of dispersing semiconductor particles may be used without limitation. Preferably, said dispersion medium may be selected, for example, from: water; alcohols such as, for example, ethanol; ketones such as, for example, acetone, acetylacetone; hydrocarbons such as, for example, hexane; or mixtures thereof. Water may be preferable because it minimizes change in viscosity of slurry. Optionally, a dispersion stabilizer may be used in order to stabilize the dispersion of the oxide semiconductor particles. Preferably, said dispersion stabilizer may be selected, for example, from: acids such as, for example, acetic acid, hydrochloric acid, nitric acid, acrylic acid; ketones such as, for example, acetylacetone; glycols such as, for example, polyethyleneglycol; alcohols such as, for example, polyvinylalcohol; or mixtures thereof.

The substrate on which slurry is applied may be sintered, and the sintering temperature may be higher than or equal to 100° C., preferably higher than or equal to 200° C. In any case, the upper limit of the sintering temperature may be the melting point or the softening point of the substrate, commonly 900° C., preferably 600° C. The sintering time may not be specifically limited, but preferably is within 4 hours.

The thickness of the thin film on the substrate may ranges from 1 μm to 200 μm, preferably may ranges from 1 μm to 50 μm. The oxide semiconductor thin film may be subjected to a secondary treatment. For example, the thin film may be immersed in a solution of alkoxide, chloride, nitride, or sulfide, of the metal identical to the semiconductor, and dried or re-sintered, thereby improving the property of the thin film. The metal alkoxide may be selected, for example, from: titanium ethoxide, titanium iso-propoxide, titanium t-butoxide, n-dibutyl-diacetyl tin, or mixtures thereof. Preferably, an alcohol solution of said metal alkoxide may be used. The metal chloride may be selected, for example, from: titanium tetrachloride, tin tetrachloride, zinc chloride, or mixtures thereof. Preferably, an aqueous solution of said metal chloride may be used. Thus obtained oxide semiconductor thin film may be comprised of oxide semiconductor particles.

The method for supporting organic dye on oxide semiconductor particles in the form of a thin film may not be specifically limited, and for example, a substrate having the oxide semiconductor thin film formed thereon may be immersed in a solution obtained by dissolving the organic dye having general formula (I) in a solvent capable of dissolving the same, or in a dispersion obtained by dispersing said organic dye having general formula (I). The concentration of the solution or of the dispersion, may be appropriately determined. Immersion temperature may range from −60° C. to 100° C., preferably from 0° C. to 50° C., more preferably is room temperature (25° C.), and immersion time may range from about 1 minute to 48 hours, preferably from 1 hour to 26 hours. The solvent used for dissolving the organic dye may be selected, for example, from: methanol, ethanol, acetonitrile, dichloromethane, dimethylsulfoxide, dimethylformamide, acetone, t-butanol, or mixtures thereof. Usually, the concentration of the solution may range from $1 \times 10^{-6}$ M to 1 M, preferably from $1 \times 10^{-5}$ M to $1 \times 10^{-1}$ M. Thus, a dye-sensitized photoelectric transformation element comprising oxide semiconductor particles on a dye-sensitized thin film, may be obtained.

Optionally, the organic dye having general formula (I) may be mixed with other organic dyes or metal complex dyes. The metal complex dyes that may be mixed may include, although not specifically limited, ruthenium complex or quaternary salt thereof, phthalocyanin, porphyrin; and the other organic dyes that may be mixed may include metal-free phthalocyanin, porphyrin, cyanin, merocyanin, oxonol, or triphenylmethane dye, methyne dye such as acrylate dyes described in European Patent Application EP 1,311,001, xanthenes, azo, anthraquinone, perylene dye [as described, for example by Nazeeruddin M. K., in *Journal of the American Chemical Society* (1993), Vol. 115, pag. 6382-6390]. In case two or more kinds of organic dyes are used in combination, they may be sequentially absorbed in a semiconductor thin layer, or mixed, dissolved and absorbed.

In order to prevent aggregation of the organic dye on the oxide semiconductor thin layer, optionally, the organic dye having general formula (I), may be mixed with an inclusion compound: the obtained mixture may be adsorbed on a semiconductor thin layer. The inclusion compound may be selected, for example, from: cholic acids such as deoxycholic acid, dehydrodeoxycholic acid, kenodeoxycholic acid, cholic acid methyl ester, cholic acid sodium; polyethyleneoxides; crown ethers; cyclodextrins; calyxarenes; or mixtures thereof.

After the organic dye is supported, the surface of a semiconductor electrode may be treated with a compound which can be selected from: amine compounds such as, for example, 4-t-butyl pyridine; alcohols such as, for example, methanol, ethanol, butanol, or mixtures thereof; organic acids such as, for example, acetic acid, propionic acid, or mixtures thereof; or mixtures thereof. For example, a substrate having a dye-supported semiconductor particle thin film formed thereon may be immersed in an ethanol solution of amine.

According to a further aspect, the present invention also relates to a dye-sensitized solar cell (DSSC) comprising the dye-sensitized photoelectric transformation element above described.

Said dye-sensitized solar cell (DSSC) may be prepared by methods know in the art of preparing a dye-sensitized solar cell (DSSC) using photoelectric transformation element of the prior art, except of using a dye-sensitized photoelectric transformation element comprising oxide semiconductor particles where the organic dye having general formula (I) is supported. The dye-sensitized solar cell (DSSC) may comprise a photoelectric transformation element electrode (negative electrode) wherein the organic dye having general formula (I) is supported on the oxide semiconductor particles, a counter electrode (positive electrode), redox electrolyte, hole transporting material, or p-type semiconductor.

Preferably, the dye-sensitized solar cell (DSSC) according to the present invention may be prepared by coating titanium dioxide paste on a transparent conductive substrate; sintering the coated substrate to form a titanium dioxide thin film; immersing the substrate having titanium dioxide thin film formed thereon in a mixed solution in which the organic dye having general formula (I) is dissolved, so as to form a dye-absorbed titanium dioxide film electrode; providing a second transparent conductive substrate having a counter electrode formed thereon; forming a hole penetrating the second transparent conductive substrate and the counter electrode; placing thermoplastic polymer film between the counter electrode and the dye-absorbed titanium dioxide film electrode and heat-pressing them to join the counter electrode and the titanium dioxide film electrode; injecting electrolyte into the thermoplastic polymer film placed between the counter electrode and the titanium dioxide film electrode through the hole; and, sealing the hole with suitable materials which may be selected, for example, from thermoplastic polymers.

The redox electrolyte, hole transporting material, or p-type semiconductor may be liquid, a coagulated form (gel and gel phase), solid. The liquid may be selected, for example, from those obtained by dissolving redox electrolyte, dissolved salt, hole transporting material, or p-type semiconductor in a solvent, and a room temperature dissolved salt. The coagulated form (gel and gel phase) may be selected, for example, from those obtained by including redox electrolyte, a dissolved salt, hole transporting material, or p-type semiconductor in a polymer matrix or low molecular gellant. The solid may be selected, for example, from redox electrolyte, a dissolved salt, hole transporting material, or p-type semiconductor.

The hole transporting material may be selected, for example, from: amine derivatives; conductive polymers such as, for example, polyacetylene, polyaniline, polythiophene; or discotic liquids crystal phase such as, for example, triphenylene. The p-type semiconductor may be selected, for example, from CuI, CuSCN. As the counter electrode, those having conductivity and catalytic function on reduction of redox electrolyte may be preferably used, and, for example, those obtained by depositing platinum, carbon, rhodium, ruthenium, on a glass or a polymer film, or applying conductive particles thereon may be used.

The redox electrolyte used in the dye-sensitized solar cell (DSSC) according to the present invention may include halogen redox electrolyte comprising halogen compounds comprising halogen ion as a counter ion and a halogen molecule; metal redox electrolytes such as ferrocyanide-ferrocyanide or ferrocene-ferricynium ion; metal complexes such as cobalt complexes; organic redox electrolytes such as, for example, alkylthio-alkyldisulfide, viologen dye, hydroquinone-quinone; halogen redox electrolytes may be preferable. As the halogen molecule comprised in the halogen redox electrolyte, an iodine molecule may be preferable. As the halogen compounds comprising halogen ion as counter ion, a halogenated metal salt such as, for example, LiI, NaI, KI, $CaI_2$, $MgI_2$, CuI, or an organic ammonium salt of halogen such as, for example, tetraalkylammonium iodide, imidazolium iodide, pyridium iodide, or $I_2$, may be used.

In case the redox electrolyte is in the form of a solution comprising the same, an electrochemically inert solvent may be used. For example, acetonitrile, propylenecarbonate, etylenecarbonate, 3-methoxypropionitrile, methoxy-acetonitrile, valeronitrile, ethyleneglycol, propyleneglycol, diethyleneglycol, triethyleneglycol, butyrolactone, dimethoxyethane, dimethylcarbonate, 1,3-dioxolane, methylformate, 2-methyltetrahydrofuran, 3-methoxy-oxazolidin-2-on, sulforane, tetrahydrofuran, water, may be used. Acetonitrile, valeronitrile, propylenecarbonate, ethylenecarbonate, 3-methoxypropionitrile, ethyleneglycol, 3-methoxy-oxazolidin-2-on, or butyrolactone, may be preferable. Said solvents may be used alone or in combination.

As a gel phase positive electrolyte, those obtained by including electrolyte or electrolyte solution in oligomer or polymer matrix, or including electrolyte or electrolyte solution in a starch gellant, may be used.

The concentration of the redox electrolyte may preferably ranges from 0.01% by weight to 99% by weight, and more preferably from 0.1% by weight to 30% by weight, with respect to the total weight of the solution.

The dye-sensitized solar cell (DSSC) according to the present invention may be obtained by disposing a photoelectric transformation element (negative electrode) wherein the organic dye is supported on oxide semiconductor particles on a substrate and a counter electrode (positive electrode) opposite thereto, and filling a redox electrolyte containing solution therebetween.

The present invention will be further illustrated below by means of the following examples which are given for purely indicative purposes and without any limitation of this invention.

EXAMPLES

Reagents and Materials

The reagents and materials used in the following examples, as well as their manufacturers, have been below reported:
  2-bromo-3-octyl-thiophene (Aldrich): used as such;
  dibromoethane (Aldrich): used as such;
  anydrous diethyl ether (Aldrich): used as such;
  magnesium turnings (Aldrich): used as such;
  2,5-dibromothiophene (Aldrich): used as such;
  2-bromothiophene (Aldrich): used as such;
  1,3-bis(diphenylphosphino)propane]dichloronickel(II) [Ni(dppp)$Cl_2$] (Aldrich): used as such;
  diethyl ether (Aldrich): used as such;
  magnesium sulfate ($MgSO_4$) (Aldrich): used as such;
  hydrochloric acid (HCl) solution 2 M (Aldrich): used as such;
  petroleum ether (Aldrich): used as such;
  phosphorous oxychloride ($POCl_3$) (Aldrich): used as such;
  dimethylformamide (DMF) (Aldrich): used as such;
  1,2-dichloroethane ($C_2H_4Cl_2$) (Aldrich): used as such;
  dichloromethane ($CH_2Cl_2$) (Aldrich): used as such;
  sodium acetate ($C_2H_3NaO_2$) (Aldrich): used as such;
  N-bromosuccinimide (Aldrich): used as such;
  chloroform (Aldrich): used as such;
  acetic acid (Aldrich): used as such;
  sodium sulfate ($Na_2SO_4$) (Aldrich): used as such;
  n-butil lithium (Aldrich): used as such;
  hexane (Carlo Erba): used as such;
  3,4-ethylenedioxythiophene (EDOT) (Aldrich): used as such;
  tetrahydrofuran (THF) (Aldrich): used as such;
  anhydrous tetrahydrofuran (Aldrich): used as such;
  1-bromohexane (Aldrich): used as such;
  ammonium chloride ($NH_4Cl$) (Aldrich): used as such;
  tri-n-butyl tin chloride (Aldrich): used as such;
  tri-n-butyl tin bromide (Aldrich): used as such;
  sodium fluoride (NaF) (Aldrich): used as such;
  sodium bicarbonate ($NaHCO_3$) (Aldrich): used as such or in aqueous solution 1 M;
  Celite® 545 (Aldrich): used as such;
  tetrakis(triphenylphosphine)palladium(0) [Pd(PPh$_3$)$_4$] (Aldrich): used as such;
  anhydrous toluene (Aldrich): used as such;
  cyanoacetic acid (Aldrich): used as such;
  ammonium acetate (Aldrich): used as such;
  glacial acetic acid (Aldrich): used as such;
  sodium hydroxide (NaOH) (Aldrich): used as such;
  titanium tetrachloride (Aldrich): used as such;
  N-methyl-N-butylimidazolium iodide (Aldrich): used as such;
  iodine (Carlo Erba): used as such;
  lithium iodide (Aldrich): used as such;
  guanidinium-thiocyanate (Aldrich): used as such;

t-butylpyridine (Aldrich): used as such;
valeronitrile (Aldrich): used as such;
acetonitrile (Carlo Erba): used as such;
2-(tri-butylstannyl)thiophene (Aldrich): used as such;
3,4-ethylenedithiothiophene (Aldrich): used as such.

In the following examples the characterization methods below reported have been used.

NMR Spectra

The NMR spectra of the obtained compounds have been carried out with a spectrometer NMR Bruker Avance 400.

To this aim, about 10 mg of the sample to be examined have been dissolved in about 0.8 ml of a suitable deuterated solvent directly on the glass pipe used for the measurement. The chemical shifts scale has been calibrated with respect to the tetramethylsilane signal set to 0 ppm.

Mass Spectra

The mass spectra of the compounds obtained have been carried out with a reverse-geometry double-focusing spectrometer AT 95S DCI ("Desorption Chemical Ionization") with iso-butane as reagent gas in ions positive mode. The filament emission current has been calibrated at 0.1 mA with an electron beam energy equal to 100 eV and with a ions source temperature kept to 90° C.

Example 1

Synthesis of 5-carboxycyanovinylen-3,3"-dioctyl-3''',4'''ethylenedioxy-5'''-hexyl-2,2':5',2":5",2'''quaterthiophene having Formula (Ia)

Synthesis of 2-(3-octylthienyl)magnesium bromide having Formula (2)

In a 100 ml flask, a solution of 2-bromo-3-octylthiophene having formula (1) (3.0 g, 10.89 mmol) and dibromoethane (0.93 ml, 10.89 mmol) in 10 ml of anhydrous diethyl ether, was added, dropwise, to a suspension of magnesium turnings (Mg) (0.53 g) in 50 ml of anhydrous diethyl ether, under argon (Ar) atmosphere, sonicated for 30 minutes, and heated at the reflux temperature of the solvent for another 90 minutes: after the elimination of the excess of magnesium turnings by filtration, a solution containing 2-(3-octylthienyl)magnesium bromide having formula (2) (Grignard reagent) was obtained and was immediately used in the following coupling reaction.

Synthesis of 3,3"-dioctyl-2,2':5',2"-terthiophene having Formula (3)

A solution containing 2-(3-octylthienyl) magnesium bromide having formula (2), obtained as described above, was slowly added, at 0° C., in a 100 ml flask containing a solution of 2,5-dibromothiophene (0.4 ml, 3.63 mmol) and 1,3-bis(diphenylphosphino)propane]dichloronickel (II) [Ni (dppp)Cl$_2$] (0.18 g, 0.4 mmol) in 50 ml of anhydrous diethyl ether. The obtained reaction mixture was heated at the reflux temperature of the solvent, for 18 hours, subsequently cooled to room temperature (25° C.) and then treated with a

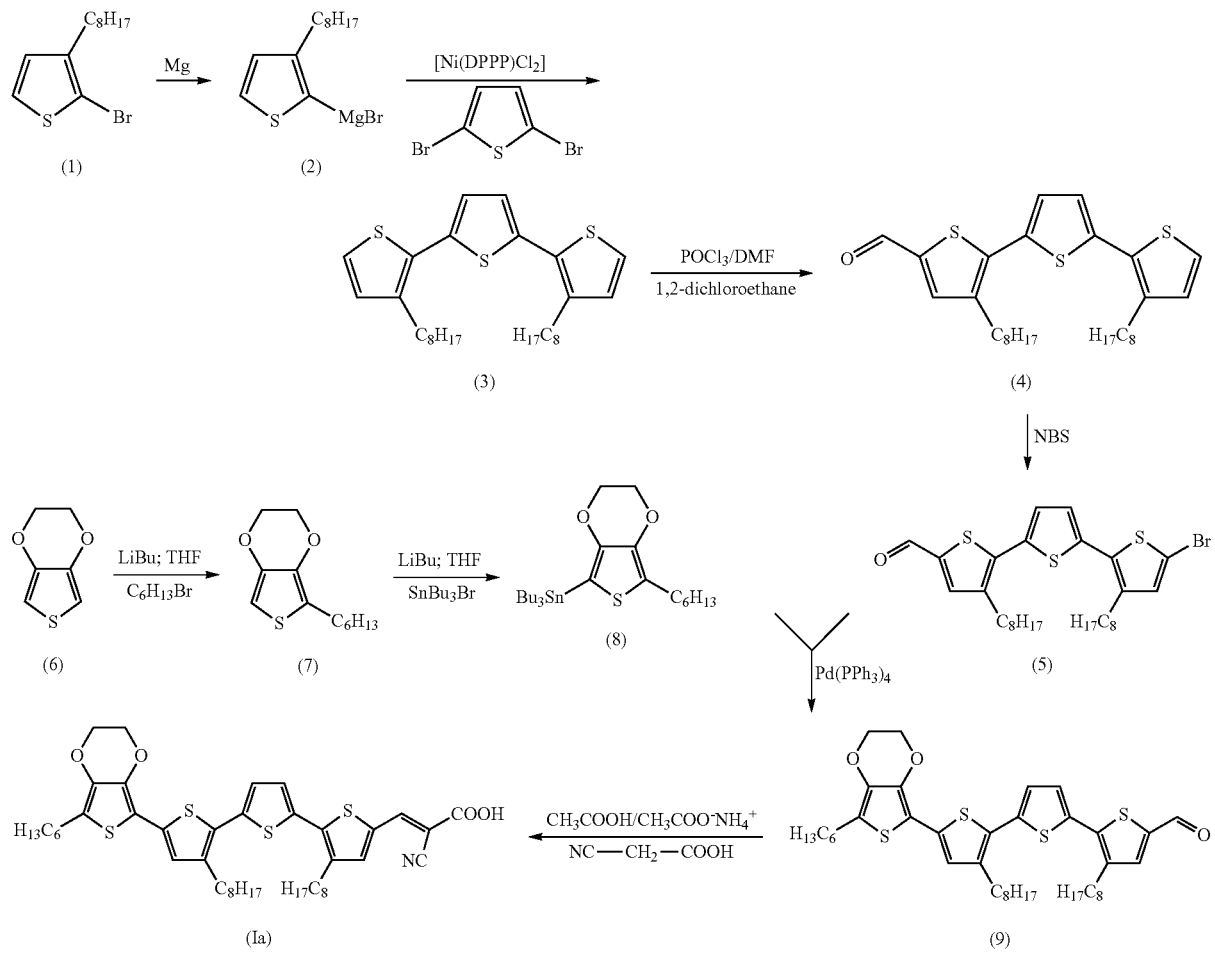

mixture of crushed ice and 50 ml of 2 M hydrochloric acid (HCl) solution. Subsequently, the cooled reaction mixture was extracted with diethyl ether (3×20 ml). The overall organic phase (obtained by joining the organic phases obtained as described above) was thoroughly washed with water, then with 1 M aqueous solution of sodium bicarbonate ($NaHCO_3$), then with brine, again with water, and finally was dried over magnesium sulfate ($MgSO_4$), at room temperature (25° C.), for 3 hours. The solvent was subsequently evaporated at reduced pressure and the obtained residue was purified by chromatography on silica gel using petroleum ether as eluent obtaining 1.65 g (97% yield) of 3,3"-dioctyl-2,2':5',2"-terthiophene having formula (3), as a yellow liquid, which was characterized by $^1H$ NMR (300 MHz, $CDCl_3$) obtaining the following spectrum: 7.18 (d, 2H), 7.05 (s, 2H), 6.94 (d, 2H), 2.77 (t, 4H), 1.65-1.59 (m, 4H), 1.39-1.26 (m, 20H), 0.87 (t, 6H).

Synthesis of 5-formyl-3,3"-dioctyl-2,2':5',2"-terthiophene having Formula (4)

A Vilsmeier reagent, which was prepared adding 0.5 ml (5.3 mmol) of phosphorous oxychloride ($POCl_3$) in 3.0 ml of dry dimethylformamide (DMF) was added, in a 100 ml flask, to a cold solution (0° C.) of 3,3"-dioctyl-2,2':5',2"-terthiophene having formula (3) (1.67 g, 3.53 mmol), obtained as described above, in 1,2-dichloroethane ($C_2H_4Cl_2$) (50 ml), under argon (Ar) atmosphere. The obtained reaction mixture was stirred at 70° C., for 24 hours, subsequently cooled to room temperature (25° C.) and diluted with 25 ml of dichloromethane ($CH_2Cl_2$). The obtained reaction mixture was treated with 50 ml of an aqueous solution of sodium acetate ($C_2H_3NaO_2$) and stirred for 2 hours, at room temperature (25° C.), obtaining an organic phase and an aqueous phase which were separated. The organic phase was washed with water (2×10 ml), brine (2×10 ml) and dried over magnesium sulfate ($MgSO_4$), at room temperature (25° C.), for 3 hours. The solvent was subsequently evaporated at reduced pressure and the obtained residue was purified by chromatography on silica gel using a mixture of dichloromethane ($CH_2Cl_2$) and petroleum ether (1:1, v/v) as eluent obtaining 1.57 g (89% yield) of 5-formyl-3,3"-dioctyl-2,2':5',2"-terthiophene having formula (4) which was characterized by $^1H$ NMR (300 MHz, $CDCl_3$) obtaining the following spectrum: 9.83 (s, 1H), 7.59 (s, 1H), 7.27 (dd, 2H), 7.10 (d, 1H), 6.96 (d, 1H), 2.85-2.75 (m, 4H), 1.17-1.54 (m, 4H), 1.14-1.26 (m, 20H), 0.88-0.85 (m, 6H).

Synthesis of 5-formyl-5"-bromo-3,3"-dioctyl-2,2':5', 2"-terthiophene Having Formula (5)

In a 100 ml flask, N-bromosuccinimide (NBS) (0.61 g, 3.44 mmol) was added, in small portions, to a solution of 5-formyl-3,3"-dioctyl-2,2':5',2"-terthiophene having formula (4) (1.57 g, 3.13 mmol), obtained as described above, in 100 ml of a mixture of chloroform and acetic acid (1:1, v/v), at 0° C. The reaction mixture was heated at room temperature (25° C.) and stirred for additional 3 hours. Subsequently, the reaction mixture was poured into water and extracted with dichloromethane ($CH_2Cl_2$) (3×20 ml). The overall organic phase (obtained by joining the organic phases obtained as described above) was thoroughly washed with water, 1 M aqueous solution of sodium bicarbonate, brine, again with water, and then was dried over sodium sulfate ($Na_2SO_4$), at room temperature (25° C.), for 3 hours. The solvent was subsequently evaporated at reduced pressure and the obtained residue was purified by chromatography on silica gel using petroleum ether as eluent obtaining 1.6 g (89% yield) of 5-formyl-5"-bromo-3,3"-dioctyl-2,2': 5',2"-terthiophene having formula (5), as a slightly yellow oil, which was characterized by $^1H$ NMR (300 MHz, $CDCl_3$) obtaining the following spectrum: 9.83 (s, 1H), 7.59 (s, 1H), 7.23 (d, 1H), 7.05 (d, 1H), 6.91 (s, 1H), 2.81 (t, 2H), 2.71 (t, 2H), 1.73-1.56 (m, 4H), 1.14-1.26 (m, 20H), 0.89-0.85 (m, 6H).

Synthesis of 2-n-hexyl-3,4-ethylenedioxythiophene having Formula (7)

In a 100 ml flask, n-butil lithium (n-BuLi) (14.7 ml, 2.5 M in hexane, 36.9 mmol) was added, dropwise, at 0° C., to a solution containing 3,4-ethylenedioxythiophene (EDOT) having formula (6) (5.0 g, 35.2 mmol), dissolved in 40 ml of tetrahydrofuran (THF), under argon (Ar) atmosphere. The obtained reaction mixture was stirred for 1 hour, at −78° C. Subsequently, 1-bromohexane (6.5 ml, 45 mmol) was added, dropwise, at −78° C. and the obtained reaction mixture was stirred, for 30 minutes, at −78° C., and then allowed to warm slowly to room temperature (25° C.) and stirred for additional 12 hours. After dilution with diethyl ether (30 ml), a saturated aqueous solution of ammonium chloride ($NH_4Cl$) was added and the reaction mixture was stirred, for 1 hour, at room temperature (25° C.). After drying over magnesium sulfate ($MgSO_4$), at room temperature (25° C.), for 3 hours, the solvent was evaporated at reduced pressure and the residue was distillate with a Kugelrhor apparatus, operating at 160° C. and at 10 mbar, obtaining 2.2 g (30% yield) of 2-n-hexyl-3,4-ethylenedioxythiophene having formula (7), which was characterized by $^1H$ NMR (300 MHz, $CDCl_3$) obtaining the following spectrum: 6.10 (s, 1H), 4.17 (s, 4H), 2.62 (t, 2H), 1.61-1.55 (m, 2H), 1.40-1.31 (m, 6), 0.88 (t, 3H).

Synthesis of 2-tri-n-butylstannyl-5-n-hexyl-3,4-ethylenedioxythiophene having Formula (8)

In a 100 ml flask, n-butil lithium (n-BuLi) (1.95 ml, 2.5 M in hexane, 4.86 mmol) was added dropwise, at −20° C., to a solution containing 2-n-hexyl-3,4-ethylenedioxythiophene having formula (7) (1.0 g, 4.42 mmol), obtained as described above, in 40 ml of tetrahydrofuran (THF), under argon (Ar) atmosphere. The obtained reaction mixture was stirred for 1 hour, at −20° C. Subsequently, tri-n-butyl tin bromide ($SnBu_3Br$) (1.51 ml, 5.30 mmol) was added, dropwise, at −20° C., and the obtained reaction mixture was stirred, for 30 minutes, at −20° C., and then allowed to warm slowly to room temperature (25° C.). After dilution with diethyl ether (30 ml), a saturated aqueous solution of sodium fluoride (NaF) was added and the reaction mixture was stirred, for 1 hour, at room temperature (25° C.). The obtained precipitate was filtered off by using Celite® 545 and the obtained filtrate was washed with a saturated aqueous solution of sodium bicarbonate ($NaHCO_3$), then with water. After drying over magnesium sulfate ($MgSO_4$), at room temperature (25° C.), for 3 hours, the solvent was evaporated at reduced pressure obtaining 2-tri-n-butylstannyl-5-n-hexyl-3,4-ethylenedioxythiophene having formula (8), which was used in the following steps without further purifications.

Said compounds having formula (8) was characterized by $^1H$ NMR (300 MHz, $CDCl_3$) obtaining the following spectrum: 4.12 (s, 4H), 2.62 (t, 2H), 1.61-1.55 (m, 8H), 1.45-1.28 (m, 12), 1.05 (t, 6H), 0.91-0.86 (m, 12H).

Synthesis of 5-formyl-3,3''-dioctyl-3''',4'''ethylenedioxy-5'''-hexyl-2,2':5',2'':5'',2'''-quaterthiophene having Formula (9)

In a 100 ml flask, a mixture of 5-formyl-5''-bromo-3,3''-dioctyl-2,2':5',2''-terthiophene having formula (5) (0.20 g, 0.35 mmol), obtained as described above, 2-tri-n-butylstannyl-5-n-hexyl-3,4-ethylenedioxythiophene having formula (8) (0.21 g, 0.41 mmol), obtained as described above, and tetrakis(triphenylphosphine) palladium(0) [Pd(PPh$_3$)$_4$] (20 mg, 0.017 mmol), in 50 ml of anhydrous toluene, was heated at the reflux temperature of the solvent overnight. The obtained reaction mixture was cooled to room temperature (25° C.) and the solvent was evaporated at reduced pressure. The residue was dissolved in 30 ml of dichloromethane (CH$_2$Cl$_2$) and the obtained solution was washed with a 1 M aqueous solution of sodium bicarbonate (NaHCO$_3$) (2×20 ml), subsequently with water (3×20 ml) and finally was dried over magnesium sulfate (MgSO$_4$), at room temperature (25° C.), for 3 hours. The solvent was subsequently evaporated at reduced pressure and the obtained residue was purified by chromatography on silica gel using a mixture of dichloromethane (CH$_2$Cl$_2$) and petroleum ether (1:1, v/v) as eluent obtaining 0.12 g (48% yield) of 5-formyl-3,3''-dioctyl-3''',4'''ethylenedioxy-5'''-hexyl-2,2':5',2'':5'',2'''-quaterthiophene having formula (9), as a yellowish oil, which was characterized by $^1$H NMR (300 MHz, CDCl$_3$) obtaining the following spectrum: 9.82 (s, 1H), 7.59 (s, 1H), 7.24 (d, 1H), 7.09 (d, 1H), 6.96 (s, 1H), 4.34-4.32 (m, 2H), 4.24-4.21 (m, 2H), 2.85-2.72 (m, 4H), 2.66-2.61 (m, 2H), 1.71-1.60 (m, 6H), 1.40-1.23 (m, 26), 0.91-0.84 (m, 9H).

Said compound having formula (9) was also characterized by $^{13}$C NMR (75 MHz, CDCl$_3$) obtaining the following spectrum: 182.8, 141.1, 140.9, 140.7, 140.4, 139.7, 139.0, 138.4, 138.1, 134.2, 128.2, 127.5, 125.8, 125.2, 117.2, 107.6, 65.6, 64.9, 32.2, 31.9, 30.8, 30.7, 30.6, 29.9, 29.8, 29.7, 29.6, 29.1, 26.0, 23.0, 22.9, 14.2.

Furthermore, said compound having formula (9) was also characterized by mass spectra: HRMS (ESI) obtaining: [M]: 724.3110; calculated for C$_{41}$H$_{56}$O$_3$S$_4$: 724.3112.

Synthesis of 5-carboxycyanovinylen-3,3''-dioctyl-3''',4'''ethylenedioxy-5'''-hexyl-2,2':5',2'':5'',2'''-quaterthiophene having Formula (Ia)

In a 250 ml flask, were introduced 80 mg (0.11 mmol) of 5-formyl-3,3''-dioctyl-3''',4'''ethylenedioxy-5'''-hexyl-2,2':5',2'':5'',2'''-quaterthiophene having formula (9), obtained as described above, and mixed with cyanoacetic acid (NC—CH$_2$—COOH) (20 mg, 0.22 mmol), ammonium acetate (CH$_3$COO$^-$NH$_4^+$) (53 mg, 0.66 mmol) and 20 ml of glacial acetic acid (CH$_3$COOH). The obtained reaction mixture was heated at the reflux temperature of the solvent, for 12 hours, and subsequently cooled to room temperature (25° C.), obtaining a dark precipitate which was recovered by filtration and washed with a diluted aqueous solution of sodium hydroxide and water obtaining 80 mg (92% yield) of 5-carboxycyanovinylen-3,3''-dioctyl-3''',4'''ethylenedioxy-5'''-hexyl-2,2':5',2'':5'',2'''-quaterthiophene having formula (Ia), as a black solid, which was characterized by $^1$H NMR (300 MHz, THF-d$^8$) obtaining the following spectrum: 8.21 (s, 1H), 7.68 (s, 1H), 7.31 (d, 1H), 7.11 (d, 1H), 6.94 (s, 1H), 4.25-4.24 (m, 2H), 4.15-4.14 (m, 2H), 2.81 (t, 2H), 2.73 (t, 2H), 2.57 (t, 2H), 1.55-1.52 (m, 2H), 1.37-1.22 (m, 30), 0.91-0.84 (m, 9H).

Said compound having formula (Ia) was also characterized by $^{13}$C NMR (75 MHz, THF-d$^8$) obtaining the following spectrum: 163.8, 146.0, 141.7, 140.9, 140.7, 139.0, 138.8, 135.0, 134.2, 126.9, 126.3, 125.3, 116.7, 116.3, 108.1, 99.6, 66.0, 65.2, 32.6, 32.3, 31.2, 31.1, 30.9, 30.3, 30.2, 30.1, 30.0, 29.8, 29.4, 26.2, 23.4, 23.3, 14.2.

Furthermore, said compound having formula (Ia) was also characterized by mass spectra: FIRMS (ESI) obtaining: [M]: 791.3196; calculated for C$_{44}$H$_{57}$NO$_4$S$_4$: 791.3170.

Example 2

Synthesis of 5-carboxycyanovinylen-3,3''-dioctyl-3'''',4''''-ethylenedioxy-5''''-hexyl-2,2':5',2'':5'',2''':5''',2''''-pentathiophene having Formula (Ib)

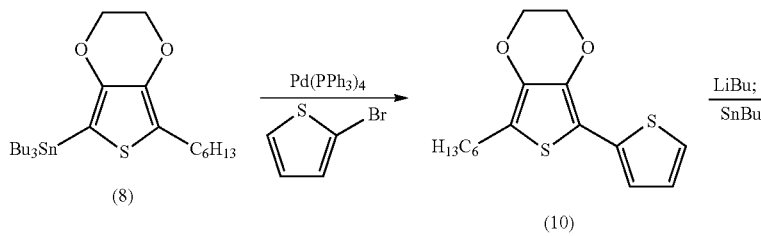

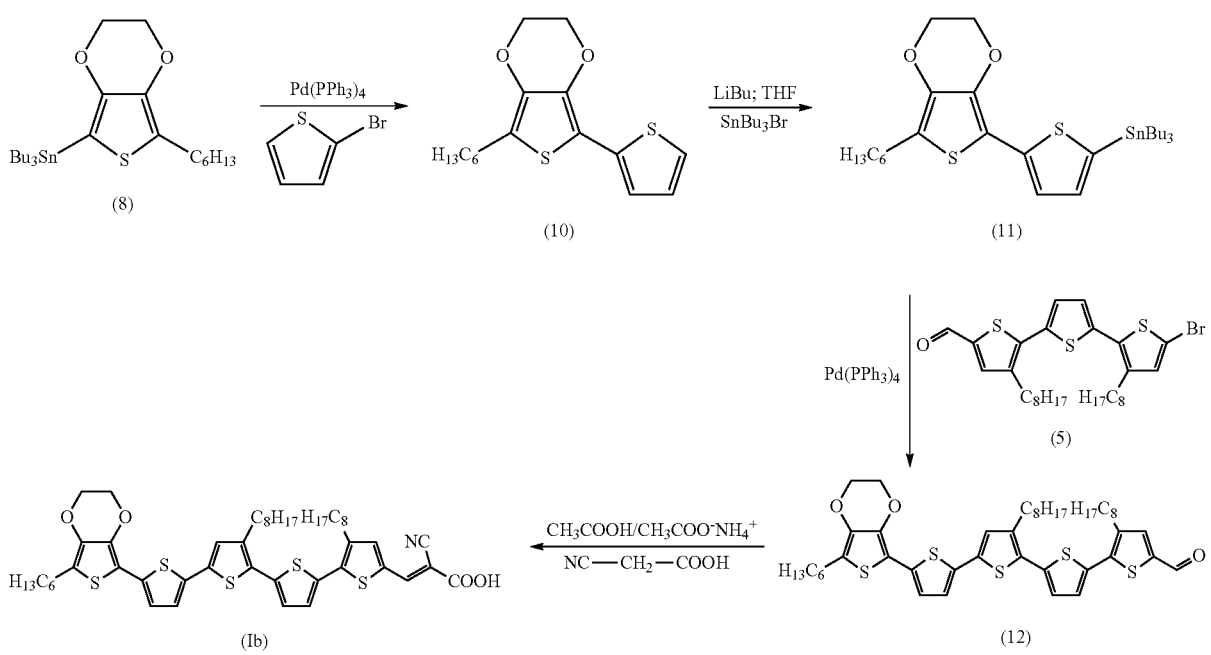

Synthesis of 3,4-ethylenedioxy-5-n-hexyl-2,2'-dithiophene having Formula (10)

In a 100 ml flask, a mixture of 2-bromothiophene (0.75 g, 4.5 mmol), 2-tri-n-butyl stannyl-5-n-hexyl-3,4-ethylenedioxythiophene having formula (8) (2.91 g, 5.63 mmol), obtained as described in Example 1, and tetrakis(triphenylphosphine) palladium(0) [Pd(PPh$_3$)$_4$] (0.26 g, 0.22 mmol), in 50 ml of anhydrous toluene, was heated at the reflux temperature of the solvent, for 12 hours. Subsequently, the obtained reaction mixture was cooled to room temperature (25° C.) and extracted with diethyl ether (3×20 ml). The overall organic phase (obtained by joining the organic phases obtained as described above) was thoroughly washed with water (2×10 ml), then with 1 M aqueous solution of sodium bicarbonate (NaHCO$_3$) (2×10 ml), then with brine (2×10 ml), again with water (2×10 ml), and finally was dried over magnesium sulfate (MgSO$_4$), at room temperature (25° C.), for 3 hours. The solvent was subsequently evaporated at reduced pressure and the obtained residue was purified by chromatography on silica gel using petroleum ether as eluent obtaining 0.78 g (56% yield) of 3,4-ethylenedioxy-5-n-hexyl-2,2'-dithiophene having formula (10), as a yellowish oil, which was characterized by $^1$H NMR (300 MHz, CDCl$_3$) obtaining the following spectrum: 7.16 (dd, 1H), 7.14 (dd, 1H), 7.00 (dd, 1H), 4.32-4.29 (m, 2H), 4.24-4.20 (m, 2H), 2.63 (t, 2H), 1.65-1.55 (m, 2H), 1.39-1.27 (m, 6), 0.92-0.86 (m, 3H).

Said compound having formula (10) was also characterized by $^{13}$C NMR (300 MHz, CDCl$_3$): 137.4, 137.2, 135.1, 126.9, 122.9, 121.9, 116.1, 107.8, 65.0, 64.5, 31.5, 30.3, 28.7, 25.6, 22.5, 14.1.

Furthermore, said compound having formula (10) was also characterized by mass spectra: MS MALDI and HRMS (ESI) obtaining: [M]: 309.09 and 309.0980, respectively; calculated for C$_{16}$H$_{20}$O$_2$S$_2$: 308.0905.

Synthesis of 3,4-ethylenedioxy-5-n-hexyl-5'-tri-n-butylstannyl-2,2'-dithiophene having Formula (11)

In a 100 ml flask, n-butil lithium (n-BuLi) (1.95 ml, 2.5 M in hexane, 4.86 mmol) was added dropwise, at −78° C., to a solution containing 3,4-ethylenedioxy-5-n-hexyl-2,2'-dithiophene having formula (10) (0.41 g, 1.12 mmol), obtained as described above, in 40 ml of tetrahydrofuran (THF), under argon (Ar) atmosphere. The obtained reaction mixture was stirred for 1 hour, at −78° C. Subsequently, tri-n-butyl tin bromide (1.51 ml, 5.30 mmol) was added, dropwise, at −40° C. and the obtained reaction mixture was stirred, for 30 minutes, at −40° C., and then allowed to warm slowly to room temperature (25° C.). After dilution with diethyl ether (30 ml), a saturated aqueous solution of sodium fluoride (NaF) was added and the reaction mixture was stirred, for 1 hour, at room temperature (25° C.). The obtained precipitate was filtered off by using Celite® 545 and the obtained filtrate was washed with a saturated aqueous solution of sodium bicarbonate (NaHCO$_3$) then with water. After drying over magnesium sulfate (MgSO$_4$), at room temperature (25° C.), for 3 hours, the solvent was evaporated at reduced pressure obtaining 3,4-ethylenedioxy-5-n-hexyl-5'-tri-n-butylstannyl-2,2'-dithiophene having formula (11), which was used in the following steps without further purification.

Said compound having formula (11) was characterized by $^1$H NMR (300 MHz, CDCl$_3$) obtaining the following spectrum: 7.27 (d, 2H), 7.04 (d, 2H), 4.32-4.29 (m, 2H), 4.24-4.20 (m, 2H), 2.63 (t, 2H), 1.65-1.50 (m, 8H), 1.41-1.24 (m, 12), 1.13-1.06 (m, 6H), 0.94-0.86 (m, 12H).

Synthesis of 5-formyl-3,3'''-dioctyl-3'''',4''''-ethylenedioxy-5''''-hexyl-2,2':5',2'':5'',2''':5''',2''''-pentathiophene having Formula (12)

In a 100 ml flask, a mixture of 5-formyl-5''-bromo-3,3''-dioctyl-2,2':5',2''-terthiophene having formula (5) (0.74 g, 1.34 mmol), obtained as described in Example 1, 3,4-ethylenedioxy-5-n-hexyl-5'-tri-n-butylstannyl-2,2'-dithiophene having formula (11) (0.66 g, 1.12 mmol), obtained as described above, and tetrakis(triphenylphosphine)palladium (0) [Pd(PPh$_3$)$_4$] (77 mg, 0.67 mmol), in 50 ml of anhydrous toluene, was heated at the reflux temperature of the solvent, for 12 hours. Subsequently, the obtained reaction mixture was cooled to room temperature (25° C.) and extracted with diethyl ether (3×20 ml). The overall organic phase (obtained by joining the organic phases obtained as described above) was thoroughly washed with 1 M aqueous solution of sodium bicarbonate (NaHCO$_3$) (2×20 ml), then with water (3×10 ml), and finally was dried over magnesium sulfate (MgSO$_4$), at room temperature (25° C.), for 3 hours. The solvent was subsequently evaporated at reduced pressure and the obtained residue was purified by chromatography on silica gel using dichloromethane (CH$_2$Cl$_2$) as eluent obtaining 0.65 g (72% yield) of 5-formyl-3,3''-dioctyl-3'''',4''''-ethylenedioxy-5''''-hexyl-2,2':5',2'':5'',2''':5''',2''''-pentathiophene having formula (12), as a red-orange oil, which was characterized by $^1$H NMR (300 MHz, CDCl$_3$) obtaining the following spectrum: 9.61 (s, 1H), 7.58 (s, 1H), 7.24 (d, 1H), 7.09 (d, 1H), 7.05-6.99 (m, 3H), 4.33-4.32 (m, 2H), 4.24-4.23 (m, 2H), 2.84-2.72 (m, 4H), 2.64 (t, 2H), 1.69-1.56 (m, 6H), 1.39-1.28 (m, 26), 0.89-0.85 (m, 9H).

Said compound having formula (12) was also characterized by $^{13}$C NMR (75 MHz, CDCl$_3$) obtaining the following spectrum: 182.4, 141.1, 141.0, 140.1, 140.0, 139.0, 138.2, 137.6, 137.5, 136.0, 134.5, 134.1, 134.0, 128.1, 127.7, 126.0, 125.8, 123.8, 122.3, 116.8, 107.7, 65.1, 64.4, 31.8, 31.5, 30.4, 30.3, 30.2, 29.6, 29.5, 29.4, 29.2, 28.7, 25.7, 22.6, 22.5, 14.1.

Furthermore, said compound having formula (12) was also characterized by mass spectra: MS MALDI and HRMS (ESI) obtaining: [M]: 806.1 and 806.29895, respectively; calculated for C$_{45}$H$_{58}$O$_3$S$_5$: 806.29895.

Synthesis of 5-carboxycyanovinylen-3,3''-dioctyl-3'''',4''''-ethylenedioxy-5''''-hexyl-2,2':5',2'':5'',2''':5''',2''''-pentathiophene having Formula (Ib)

In a 250 ml flask, were introduced 0.2 g (0.25 mmol) of 5-formyl-3,3''-dioctyl-3'''',4''''-ethylenedioxy-5-hexyl-2,2':5',2'':5'',2''':5''',2''''-pentathiophene having formula (12), obtained as described above, and mixed with cyanoacetic acid (NC—CH$_2$—COOH) (43 mg, 0.60 mmol), ammonium acetate (CH$_3$COO$^-$NH$_4^+$) (99 mg, 1.24 mmol) and 30 ml of glacial acetic acid (CH$_3$COOH). The obtained reaction mixture was heated at the reflux temperature of the solvent, for 12 hours, and subsequently cooled to room temperature (25° C.), obtaining a dark precipitate which was recovered by filtration and washed with a diluted aqueous solution of sodium hydroxide and water obtaining 150 mg (70% yield) of 5-carboxycyanovinylen-3,3''-dioctyl-3'''',4''''-ethylenedioxy-5''''-hexyl-2,2':5',2'':5'',2''':5''',2''''-pentathiophene having formula (Ib), as black solid, which was characterized by $^1$H NMR (300 MHz, CDCl$_3$) obtaining the following spectrum: 8.20 (s, 1H), 7.60 (s, 1H), 7.30 (d, 1H), 7.10 (d, 1H), 7.04 (d, 1H), 7.01 (d, 1H), 6.97 (s, 1H), 4.34-4.32 (m, 2H), 4.24-4.21 (m, 2H), 2.84-2.73 (m, 4H), 2.64 (t, 2H), 1.72-1.58 (m, 6H), 1.45-1.36 (m, 26), 0.91-0.83 (m, 9H).

Said compound having formula (Ib) was also characterized by $^{13}$C NMR (75 MHz, CDCl$_3$) obtaining the following spectrum: 141.8, 141.2, 140.5, 139.2, 137.9, 137.6, 137.5, 136.2, 134.6, 134.0, 133.6, 132.4, 128.4, 128.1, 126.0, 125.8, 123.9, 122.3, 116.8, 107.8, 65.1, 64.4, 31.9, 31.8, 31.5, 30.3, 30.1, 29.7, 29.6, 29.5, 29.4, 29.2, 28.8, 25.7, 22.6, 22.5, 14.1.

Furthermore, said compound having formula (Ib) was also characterized by mass spectra: MS MALDI and HRMS (ESI) obtaining: [M]: 873.1 and 873.3072, respectively; calculated for C$_{48}$H$_{59}$NO$_4$S$_5$: 873.3048.

Example 3

Synthesis of 5-carboxycyanovinylen-3,3''-dioctyl-3''',4'''ethylenedioxy-2,2':5',2'':5'',2'''quaterthiophene having Formula (Ic)

C.). After dilution with diethyl ether (40 ml), a saturated aqueous solution of sodium fluoride (NaF) was added and the reaction mixture was stirred for 1 hour, at room temperature (25° C.). The obtained precipitate was filtered off using Celite® 545 and the obtained filtrate was washed with a saturated solution of sodium bicarbonate (NaHCO$_3$) (2×10 ml) then with water (3×10 ml). After drying over magnesium sulfate (MgSO$_4$), at room temperature (25° C.), for 3 hours, the solvent was evaporated at reduced pressure obtaining 2-tributylstannyl-3,4-ethylendioxythiophene having formula (13) which was used in the following steps without further purification.

Said compound having formula (13) was characterized by $^1$H NMR (300 MHz, CDCl$_3$) obtaining the following spectrum: 6.57 (s, 1H), 4.15 (s, 4H), 1.64-1.44 (m, 6H), 1.38-1.26 (m, 6H), 1.12-1.05 (m, 6H), 0.94-0.86 (m, 9H).

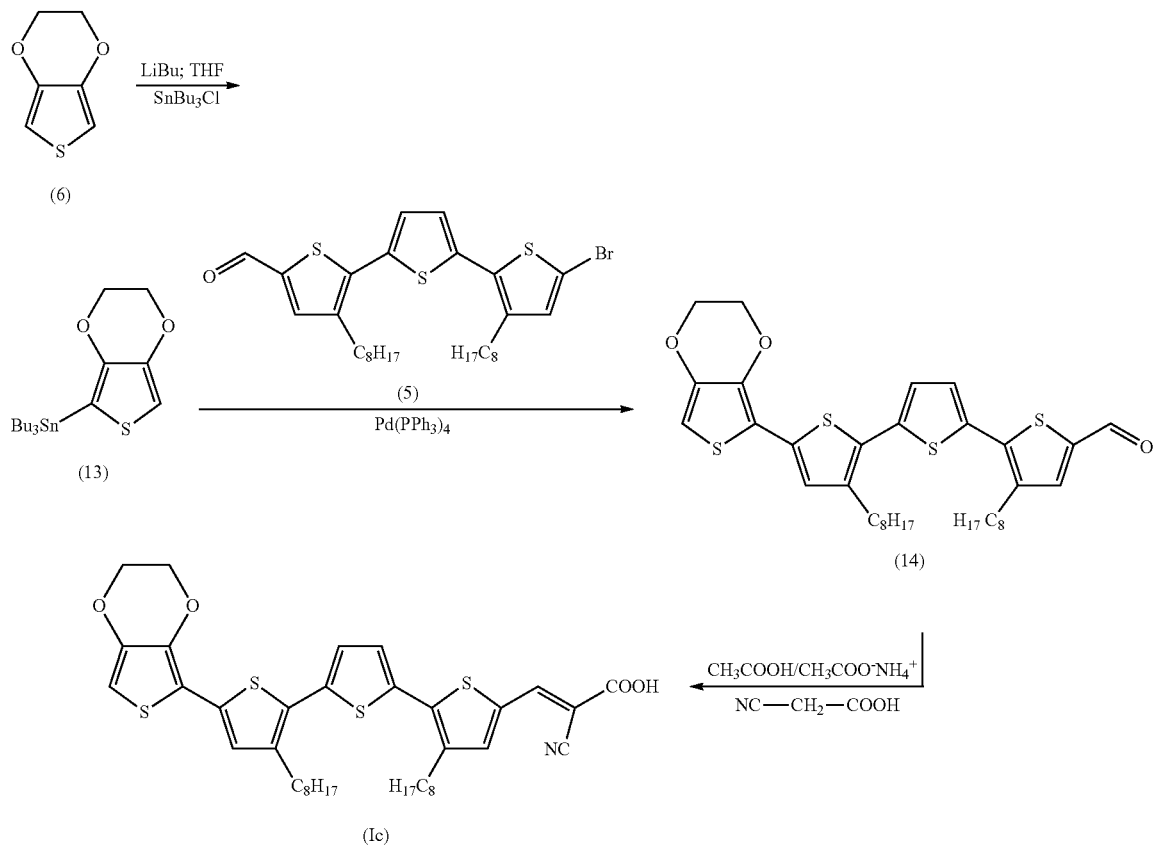

Synthesis of 2-tributylstannyl-3,4-ethylendioxythiophene having Formula (13)

In a 100 ml flask, n-butil lithium (n-BuLi) (3.09 ml, 2.5 M in hexane, 7.73 mmol) was added, dropwise, at −78° C., to a solution of 3,4-ethylendioxythiophene having formula (6) (1.0 g, 7.04 mmol) in 40 ml of dry tetrahydrofuran (THF), under argon (Ar) atmosphere: the reaction mixture was stirred for 1 hour, at −78° C. Tri-n-butyl tin chloride (2.1 ml, 7.4 mmol) was then added, dropwise, at −78° C.: the reaction mixture was stirred, at −78° C., for 30 minutes, and then was allowed to warm slowly to room temperature (25°

Synthesis of 5-formyl-3,3''-dioctyl-3''',4'''-ethylendioxy-2,2':5',2'':5'',2'''-quaterthiophene having Formula (14)

In a 100 ml flask, a mixture of 5-formyl-5'''-bromo-3,3''-dioctyl-2,2':5',2''-terthiophene having formula (5) (0.30 g, 0.52 mmol), obtained as described in Example 1, 2-tributylstannyl-3,4-ethylendioxythiophene having formula (13) (0.24 g, 0.57 mmol), obtained as described above, and tetrakis(triphenylphosphine) palladium(0) [Pd(PPh$_3$)$_4$] (60 mg, 0.051 mmol), in 50 ml of anhydrous toluene, was heated at reflux temperature of the solvent for 18 hours. The obtained reaction mixture was cooled to room temperature (25° C.) and the solvent was evaporated at reduced pressure. The residue was dissolved in 30 ml of dichloromethane ($CH_2Cl_2$) and the obtained solution was washed with a 1 M aqueous solution of sodium bicarbonate ($NaHCO_3$) (2×20 ml), subsequently with water (3×20 ml) and then was dried over magnesium sulfate ($MgSO_4$), at room temperature (25° C.), for 3 hours. The solvent was subsequently evaporated at reduced pressure and the obtained residue was purified by chromatography on silica gel using a mixture of dichloromethane ($CH_2Cl_2$) and petroleum ether (1:1, v/v) as eluent obtaining 0.31 g (94% yield) of 5-formyl-3,3"-dioctyl-3"',4"'-ethylendioxy-2,2':5',2":5",2"'-quaterthiophene having formula (14), as a yellowish oil, which was characterized by $^1$H NMR (300 MHz, $CDCl_3$) obtaining the following spectrum: 9.82 (s, 1H), 7.59 (s, 1H), 7.24 (d, 1H), 7.11 (d, 1H), 7.05 (s, 1H), 6.24 (s, 1H), 4.37-4.35 (m, 2H), 4.26-4.24 (m, 2H), 2.85-2.74 (m, 4H), 1.72-1.62 (m, 4H), 1.39-1.27 (m, 20), 0.89-0.85 (m, 6H).

Said compound having formula (14) was also characterized by $^{13}$C NMR (75 MHz, $CDCl_3$) obtaining the following spectrum: 182.5, 141.8, 141.2, 140.3, 140.1, 140.0, 139.1, 138.5, 137.8, 134.0, 133.4, 128.0, 127.8, 125.8, 125.7, 111.8, 97.2, 65.0, 64.5, 31.8, 30.5, 30.2, 29.6, 29.5, 29.4, 29.2, 22.6, 14.1.

Furthermore, said compound having formula (14) was also characterized by mass spectra: HRMS (ESI) obtaining: [M]: 640.2180 (0.9 ppm); calculated for: $C_{35}H_{44}O_3S_4$: 640.2173.

Synthesis of 5-carboxycyanovinylen-3,3"-dioctyl-3"',4"'-ethylendioxy-2,2':5',2":5",2"'-quaterthiophene having Formula (Ic)

In a 100 ml flask, were introduced (0.31 g, 0.48 mmol) of 5-formyl-3,3"-dioctyl-3"',4"'-ethylendioxy-2,2':5',2":5",2"'-quaterthiophene having formula (14), obtained as described above, cyanoacetic acid (NC—$CH_2$—COOH) (0.083 g, 0.96 mmol), ammonium acetate ($CH_3COO^-NH_4^+$) (0.22 g, 0.66 mmol) in 100 ml of glacial acetic acid ($CH_3COOH$) and the solution was heated at the reflux temperature of the solvent, for 12 hours. After slowly cooling the reaction mixture at room temperature (25° C.), a dark precipitate was formed which was recovered by filtration, washed with 10 ml of a diluted solution of sodium hydroxide and then with water (3×10 ml) obtaining 0.20 g (61% yield) of 5-carboxycyanovinylen-3,3"-dioctyl-3"',4"'-ethylendioxy-2,2':5',2":5",2"'-quaterthiophene having formula (Ic), as a black solid, which was characterized by $^1$H NMR (500 MHz, THF-$d_8$) obtaining the following spectrum: 8.29 (s, 1H), 7.75 (s, 1H), 7.39 (d, 1H), 7.20 (d, 1H), 7.10 (s, 1H), 6.33 (s, 1H), 4.34-4.33 (m, 2H), 4.23-4.21 (m, 2H), 2.88 (t, 2H), 2.81 (t, 2H), 1.44-1.42 (m, 4H), 1.36-1.29 (m, 20), 0.89-0.86 (m, 6H).

Said compound having formula (Ic) was also characterized by $^{13}$C NMR (75 MHz, THF-$d_8$) obtaining the following spectrum: 163.8, 146.0, 141.7, 140.9, 140.7, 139.0, 138.8, 135.0, 134.2, 126.9, 126.3, 125.3, 116.7, 116.3, 108.1, 99.6, 66.0, 65.2, 32.6, 32.3, 31.2, 31.1, 30.9, 30.3, 30.2, 30.1, 30.0, 29.8, 29.4, 26.2, 23.4, 23.3, 14.2.

Furthermore, said compound having formula (Ic) was also characterized by mass spectra: HRMS (ESI) obtaining: [M]: 707.2257 (3.6 ppm); calculated for: $C_{38}H_{45}NO_4S_4$: 707.2231.

Example 4

Synthesis of 5-carboxycyanovinylen-3,3""-dioctyl-3"",4""-ethylenedioxy-2,2':5',2":5",2"':5"',2""-pentathiophene having Formula (Id)

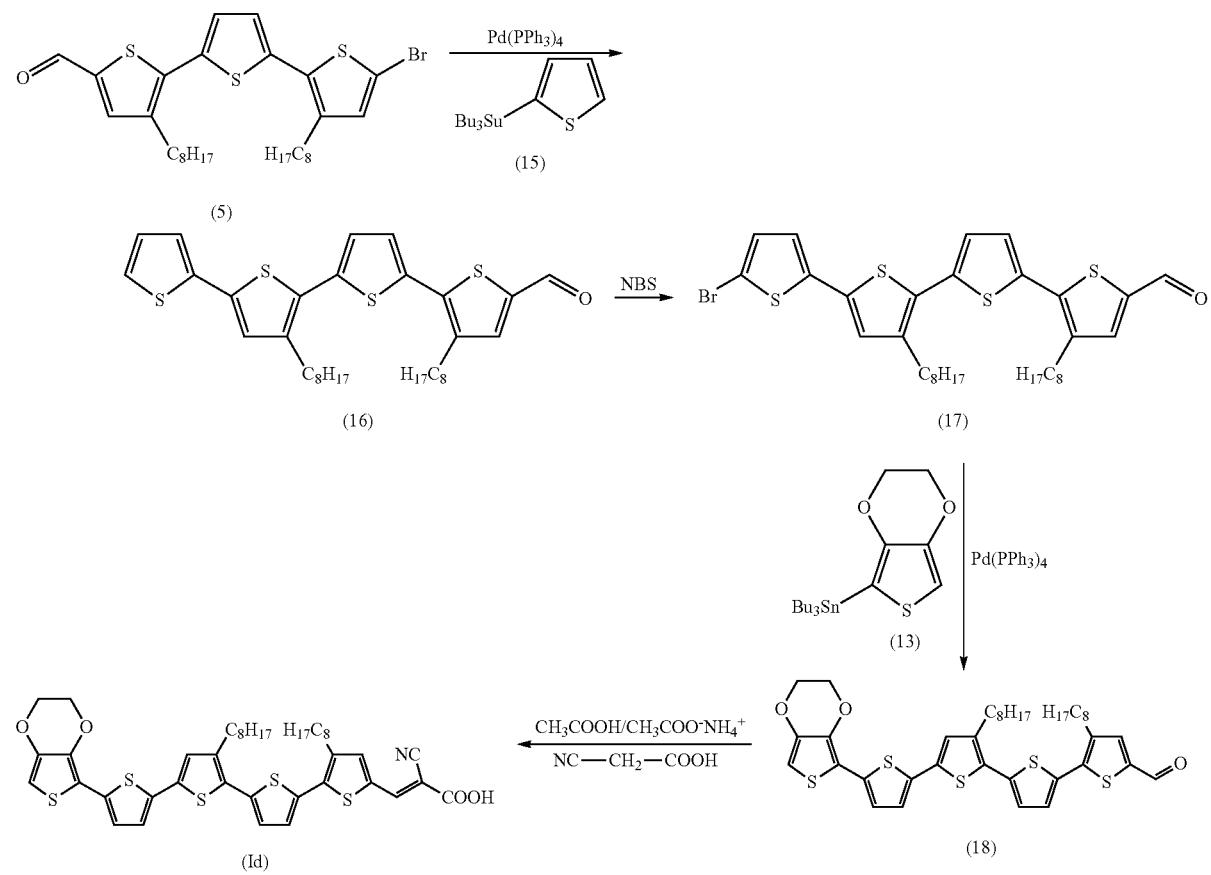

Synthesis of 5-formyl-3,3''-di-octyl-2,2':5',2'':5'',2'''-quaterthiophene having Formula (16)

In a 100 ml flask, a mixture of 5-formyl-5''-bromo-3,3''-dioctyl-2,2':5',2''-terthiophene having formula (5) (0.50 g, 0.86 mmol), obtained as described in Example 1, 2-(tributylstannyl)thiophene having formula (15) (0.34 ml, 1.04 mmol) and tetrakis(triphenylphosphine)palladium(0) [Pd(PPh$_3$)$_4$] (0.05 g, 0.043 mmol), in 50 ml of anhydrous toluene, was heated at the reflux temperature of the solvent, for 18 hours. The obtained reaction mixture was cooled to room temperature (25° C.) and the solvent was evaporated at reduced pressure. The residue was dissolved in 40 ml of dichloromethane (CH$_2$Cl$_2$) and the obtained solution was washed with a 1 M aqueous solution of sodium bicarbonate (NaHCO$_3$) (2×20 ml), subsequently with water (3×10 ml) and then was dried over magnesium sulfate (MgSO$_4$), at room temperature (25° C.), for 3 hours. The solvent was subsequently evaporated at reduced pressure and the obtained residue was purified by chromatography on silica gel using a mixture of dichloromethane (CH$_2$Cl$_2$) and petroleum ether (1:1, v/v) as eluent obtaining 0.41 g (82% yield) of 5-formyl-3,3''-di-octyl-2,2':5',2'':5'',2'''-quaterthiophene having formula (16), as a yellow oil, which was characterized by $^1$H NMR (300 MHz, CDCl$_3$) obtaining the following spectrum: 9.83 (s, 1H), 7.60 (s, 1H), 7.26-7.22 (m, 2H) 7.18 (dd, 1H), 7.12 (d, 1H), 7.04-7.01 (m, 2H), 2.85-2.74 (m, 4H), 1.70-1.66 (m, 4H), 1.42-1.27 (m, 20), 0.89-0.85 (m, 6H).

Said compound having formula (16) was also characterized by $^{13}$C NMR (75 MHz, CDCl$_3$) obtaining the following spectrum: 182.5, 141.0, 140.2, 140.1, 139.1, 138.0, 136.9, 135.7, 134.3, 128.6, 127.9, 127.8, 126.7, 126.0, 124.6, 123.8, 31.8, 30.5, 30.3, 29.5, 29.4, 29.2, 22.6, 14.1.

Furthermore, said compound having formula (16) was also characterized by mass spectra: HRMS (ESI) obtaining: [M]: 582.2134 (2.5 ppm); calculated for: C$_{33}$H$_{42}$OS$_4$: 582.2119.

Synthesis of 5-formyl-3,3''-di-octyl-5'''-bromo-2,2':5',2'':5'',2'''-quater-thiophene having Formula (17)

In a 100 ml flask, N-bromosuccinimide (0.13 g, 0.74 mmol) was added, in small portions, to a solution of 5-formyl-3,3''-di-octyl-2,2':5',2'':5'',2'''-quaterthiophene having formula (16) (0.39 g, 0.67 mmol), obtained as described above, in 40 ml of a mixture of chloroform and acetic acid (1:1, v/v), at 0° C. The reaction mixture was slowly heated at room temperature (25° C.) and stirred for further 3 hours, then was poured into water (50 ml) and extracted with dichloromethane (CH$_2$Cl$_2$) (4×20 ml). The overall organic phase (obtained by joining the organic phases obtained as described above) was thoroughly washed with water (2×10 ml), then with 1 M aqueous solution of sodium bicarbonate (NaHCO$_3$) (2×10 ml), then with brine (2×10 ml), again with water (3×10 ml), and then was dried over sodium sulfate (Na$_2$SO$_4$), at room temperature (25° C.), for 3 hours. The solvent was subsequently evaporated at reduced pressure and the obtained residue was crystallized from petroleum ether obtaining 0.32 g (73% yield) of 5-formyl-3,3''-di-octyl-5'''-bromo-2,2':5',2'': 5'',2'''-quaterthiophene having formula (17), as a slightly yellow solid, which was characterized by $^1$H NMR (300 MHz, CDCl$_3$) obtaining the following spectrum: 9.83 (s, 1H), 7.60 (s, 1H), 7.25 (d, 1H), 7.11 (d, 1H), 6.98 (d, 1H), 6.95 (d, 1H), 6.92 (d, 1H), 2.85-2.73 (m, 4H), 1.69-1.64 (m, 4H), 1.32-1.24 (m, 20), 0.89-0.85 (m, 6H).

Said compound having formula (17) was also characterized by mass spectra: HRMS (ESI) obtaining: [M]: 660.1232 (1.3 ppm); calculated for C$_{33}$H$_{41}$BrOS$_4$: 660.1224.

Synthesis of 5-formyl-3,3''-di-octyl-3'''',4''''-ethylendioxy-2,2':5',2'':5'',2''':5''',2''''-pentathiophene having Formula (18)

In a 100 ml flask, a mixture of 5-formyl-3,3''-di-octyl-5'''-bromo-2,2':5',2'':5'',2'''-quaterthiophene having formula (17) (0.22 g, 0.33 mmol), obtained as described above, 2-tributylstannyl-3,4-ethylendioxythiophene having formula (13) (0.14 g, 1.04 mmol), obtained as described in Example 3, and tetrakis(triphenylphosphine)palladium(0) [Pd(PPh$_3$)$_4$] (0.050 g, 0.042 mmol), in 50 ml of anhydrous toluene, was heated at reflux temperature of the solvent, for 16 hours. The obtained reaction mixture was cooled to room temperature (25° C.) and the solvent was evaporated at reduced pressure. The residue was dissolved in 30 ml of dichloromethane (CH$_2$Cl$_2$) and the obtained solution was washed with a 1 M aqueous solution of sodium bicarbonate (NaHCO$_3$) (2×20 ml), subsequently with water (3×10 ml) and then was dried over magnesium sulfate (MgSO$_4$), at room temperature (25° C.), for 3 hours. The solvent was subsequently evaporated at reduced pressure and the obtained residue was purified by chromatography on silica gel using dichloromethane (CH$_2$Cl$_2$) as eluent obtaining 0.19 g (80% yield) of 5-formyl-3,3''-di-octyl-3'''',4''''-ethylendioxy-2,2':5',2'':5'',2''':5''',2''''-pentathiophene having formula (18), as an orange solid, which was characterized by $^1$H NMR (300 MHz, CDCl$_3$) obtaining the following spectrum: 9.82 (s, 1H), 7.60 (s, 1H), 7.25 (d, 1H), 7.12-7.07 (m, 3H), 7.02 (s, 1H), 6.94 (s, 1H), 4.38-4.35 (m, 2H), 4.27-4.24 (m, 2H), 2.85-2.73 (m, 4H), 1.69-1.65 (m, 4H), 1.43-1.27 (m, 20), 0.89-0.85 (m, 6H).

Said compound having formula (18) was also characterized by $^{13}$C NMR (75 MHz, CDCl$_3$) obtaining the following spectrum: 182.5, 141.8, 141.0, 140.1, 139.1, 138.1, 137.7, 134.3, 127.8, 126.3, 125.9, 123.8, 123.3, 112.0, 97.2, 65.0, 64.5, 31.8, 30.4, 30.3, 29.6, 29.4, 29.4, 29.2, 22.6, 14.1.

Furthermore, said compound having formula (18) was also characterized by mass spectra: HRMS (ESI) obtaining: [M]: 722.2045 (0.8 ppm); calculated for C$_{39}$H$_{46}$O$_3$S$_5$: 722.2051.

Synthesis of 5-carboxycyanovinylen-3,3''-di-octyl-3'''',4''''-ethylendioxy-2,2':5',2'':5'',2''':5''',2''''-pentathiophene having Formula (Id)

In a 100 ml flask were introduced 0.13 g (0.18 mmol) of 5-formyl-3,3''-di-octyl-3'''',4''''-ethylendioxy-2,2':5',2'':5'',2''':5''',2''''-pentathiophene having formula (18), obtained as described above, 0.031 g, (0.36 mmol) of cyanoacetic acid (NC—CH$_2$—COOH), 0.086 g (1.08 mmol) of ammonium acetate (CH$_3$COO$^-$NH$_4^+$) and 50 ml of glacial acetic acid (CH$_3$COOH) and the solution was heated at the reflux temperature of the solvent, for 12 hours. After slowly cooling the reaction mixture to room temperature (25° C.), a dark precipitate was formed which was recovered by filtration, washed with 10 ml of a diluted solution of sodium hydroxide and then with water (3×10 ml) obtaining 0.11 g (77% yield) of 5-carboxycyanovinylen-3,3''-di-octyl-3'''',4''''-ethylendioxy-2,2':5',2'':5'',2''':5''',2''''-pentathiophene having formula (Id), as a black solid, which was characterized by $^1$H NMR (500 MHz, THF-d$_8$) obtaining the following spectrum: 10.86 (s, 1H), 8.29 (s, 1H), 7.76 (s, 1H), 7.40 (d, 1H), 7.22 (d, 1H), 7.16-7.12 (m, 3H), 6.33 (s, 1H), 4.35-4.34 (m, 2H), 4.24-4.22 (m, 2H), 2.90-2.87 (t, 2H), 2.84-2.81 (t, 2H), 1.48-1.42 (m, 4H), 1.37-1.29 (m, 20), 0.89-0.87 (m, 6H).

Said compound having formula (Id) was also characterized by $^{13}$C NMR (75 MHz, THF-d$_8$) obtaining the following spectrum: 163.7, 146.0, 143.0, 141.9, 141.7, 140.9, 139.0, 138.8, 136.7, 135.3, 135.1, 134.8, 134.8, 134.3, 129.0, 127.0, 126.9, 124.4, 123.5, 116.3, 112.0, 99.7, 97.7, 65.9, 65.3, 32.6, 31.2, 30.9, 30.3, 30.2, 30.0, 29.8, 23.4, 14.2.

Furthermore, said compound having formula (Ic) was also characterized by mass spectra: HRMS (ESI) obtaining: [M]: 789.2134 (3.16 ppm); calculated for $C_{42}H_{47}NO_4S_5$: 789.2109.

Example 5

Synthesis of 5-carboxycyanovinylen-3,3''-dioctyl-3'''',4''''-ethylenedithio-5''''-hexyl-2,2':5',2'':5'',2''':5''', 2''''-pentathiophene having Formula (Ie)

Synthesis of 2-n-hexyl-3,4-ethylenedithiothiophene having Formula (20)

In a 100 ml flask, n-butil lithium (n-BuLi) (6.0 ml, 1.6 M in hexane, 9.6 mmol) was added, dropwise, at −78° C., to a solution containing 3,4-ethylenedithiothiophene (EDTT) having formula (19) (1.6 g, 9.19 mmol), dissolved in 40 ml of dry tetrahydrofuran (THF), under argon (Ar) atmosphere. The obtained reaction mixture was stirred for 1 hour, at −78° C. Subsequently, 1-bromohexane (1.72 ml, 12 mmol) was added, dropwise, at −78° C. and the obtained reaction mixture was stirred, for 30 minutes, at −78° C., and then allowed to warm slowly to room temperature (25° C.) and stirred for additional 12 hours. After dilution with diethyl ether (30 ml), the organic phase was washed with 30 ml of a saturated solution of ammonium chloride (NH$_4$Cl), then with water (3×20 ml) and finally was dried over magnesium sulfate (MgSO$_4$), at room temperature (25° C.), for 3 hours. The solvent was subsequently evaporated at reduced pressure and the obtained residue was purified by chromatography on silica gel using a mixture of dichloromethane (CH$_2$Cl$_2$) and petroleum ether (1:2, v/v) as eluent obtaining 0.8 g (35% yield) of 2-n-hexyl-3,4-ethylenedithiothiophene having formula (20), as a colorless oil, which was charac-

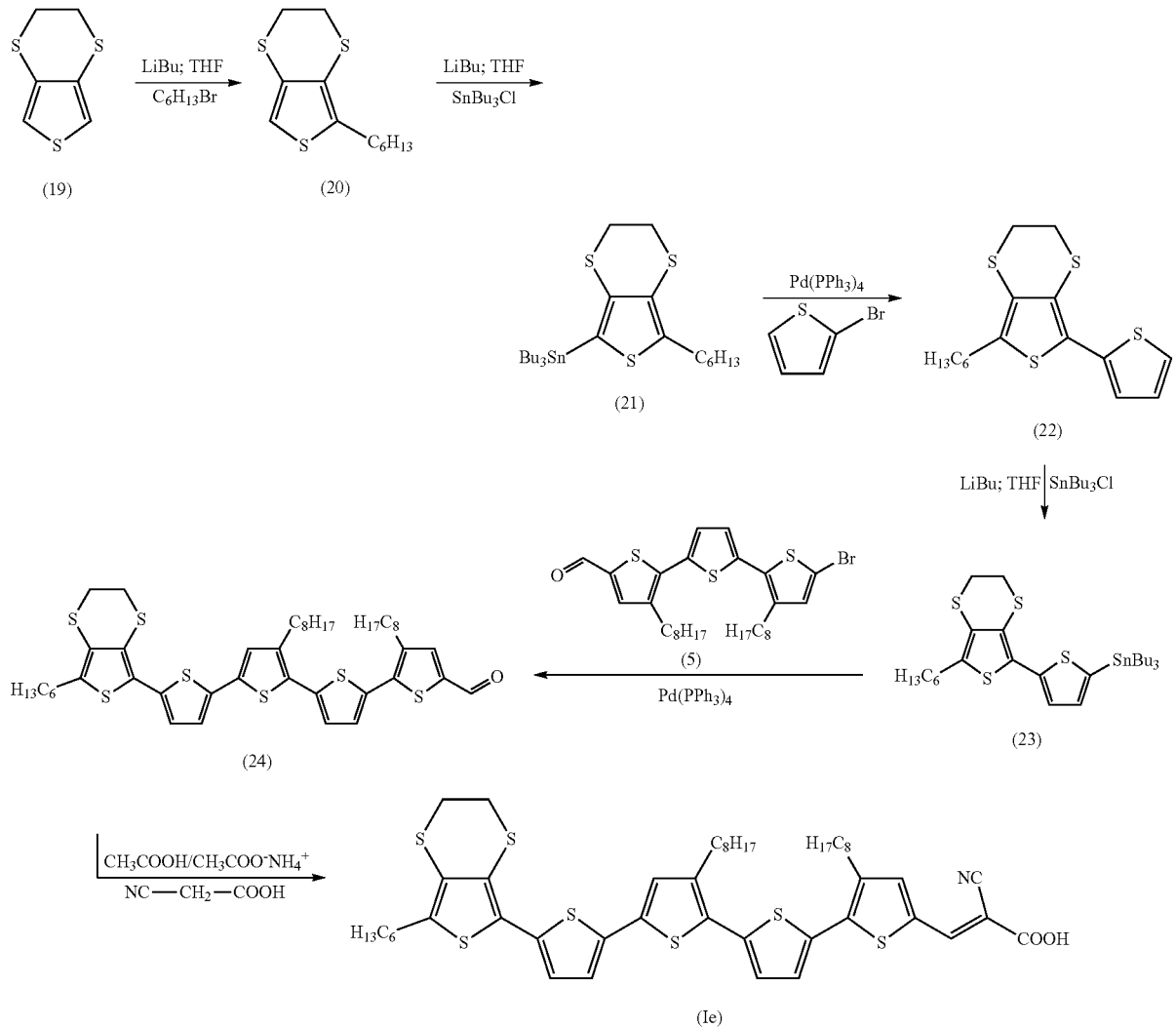

terized by $^1$H NMR (300 MHz, CDCl$_3$) obtaining the following spectrum: 6.78 (s, 1H), 3.19 (s, 4H), 2.68 (t, 2H), 1.64-1.59 (m, 2H), 1.33-1.29 (m, 6H), 0.86 (t, 3H).

Said compound having formula (20) was also characterized by $^{13}$C NMR (75 MHz, CDCl$_3$) obtaining the following spectrum: 137.1, 124.8, 120.6, 114.6, 31.5, 30.2, 28.8, 28.2, 27.8, 27.7, 22.5, 14.0.

Furthermore, said compound having formula (20) was also characterized by mass spectra: MS MALDI and HRMS (ESI) obtaining: [M]: 258.1 and 258.0574 (1.16 ppm), respectively; calculated for C$_{12}$H$_{18}$S$_3$: 258.0571.

Synthesis of 2-tri-n-butylstannyl-5-n-hexyl-3,4-ethylenedithiothiophene having Formula (21)

In a 100 ml flask, n-butil lithium (n-BuLi) (1.24 ml, 2.5 M in hexane, 3.11 mmol) was added dropwise at −20° C. to a solution of 0.73 g (2.82 mmol) of 2-n-hexyl-3,4-ethylenedithiothiophene having formula (20), obtained as described above, in 40 ml of dry tetrahydrofuran (THF), under Ar atmosphere. The reaction mixture was stirred for 1 hour, at −20° C., and tri-n-butyl tin chloride (0.97 ml, 3.38 mmol) was added, dropwise, at −20° C. The reaction mixture was stirred at −20° C. for further 30 minutes and then was allowed to warm to room temperature (25° C.). After dilution with diethyl ether (50 ml), a saturated aqueous solution of sodium fluoride (NaF) was added and the reaction mixture was stirred, for 1 hour, at room temperature (25° C.). The obtained precipitate was filtered off by using Celite® 545 and the obtained filtrate was washed with a saturated aqueous solution of sodium bicarbonate (NaHCO$_3$), then with water (3×20 ml). After drying over magnesium sulfate (MgSO$_4$), at room temperature (25° C.), for 3 hours, the solvent was evaporated at reduced pressure, obtaining 2-tri-n-butylstannyl-5-n-hexyl-3,4-ethylenedithiothiophene having formula (21), which was used in the following steps without further purification.

Said compound having formula (21) was characterized by $^1$H NMR (300 MHz, CDCl$_3$) obtaining the following spectrum: 3.19-3.16 (m, 4H), 2.70 (t, 2H), 1.64-1.50 (m, 8H), 1.39-1.26 (m, 12), 1.17-1.12 (m, 6H), 0.94-0.86 (m, 12H).

Synthesis of 3,4-ethylenedithio-5-n-hexyl-2,2'-dithiophene having Formula (22)

In a 100 ml flask a mixture of 2-bromothiophene (0.46 g, 2.81 mmol), 2-tri-n-butylstannyl-5-n-hexyl-3,4-ethylenedithiothiophene having formula (21) (1.54 g, 2.81 mmol), obtained as described above, and tetrakis(triphenyl-phosphine) palladium(0) [Pd(PPh$_3$)$_4$] (0.32 g, 0.27 mmol), in 50 ml of anhydrous toluene, was heated at the reflux temperature of the solvent for 18 hours. The obtained reaction mixture was cooled to room temperature (25° C.) and the solvent was evaporated at reduced pressure. The residue was dissolved in 40 ml of dichloromethane (CH$_2$Cl$_2$) and the obtained solution was washed with a 1 M aqueous solution of sodium bicarbonate (NaHCO$_3$) (2×20 ml), subsequently with water (3×10 ml) and then was dried over magnesium sulfate (MgSO$_4$), at room temperature (25° C.), for 3 hours. The solvent was subsequently evaporated at reduced pressure and the obtained residue was purified by chromatography on silica gel using a mixture of dichloromethane (CH$_2$Cl$_2$) and petroleum ether (1:3, v/v) as eluent obtaining 0.43 g (46% yield) of 3,4-ethylenedithio-5-n-hexyl-2,2'-dithiophene having formula (22), as a yellowish oil, which was characterized by $^1$H NMR (300 MHz, CDCl$_3$) obtaining the following spectrum: 7.28 (d, 1H), 7.23 (d, 1H), 7.06 (dd, 1H), 3.27-3.19 (m, 4H), 2.70 (t, 2H), 1.69-1.59 (m, 2H), 1.41-1.28 (m, 6), 0.92-0.85 (m, 3H).

Said compound having formula (22) was also characterized by $^{13}$C NMR (75 MHz, CDCl$_3$) obtaining the following spectrum: 135.9, 135.4, 127.3, 125.3, 124.9, 122.1, 121.9, 31.5, 30.2, 28.8, 28.4, 28.2, 27.6, 22.5, 14.0.

Furthermore, said compound having formula (22) was also characterized by mass spectra: MS MALDI and HRMS (ESI) obtaining: [M]: 340.1 and 340.0445 (<1 ppm), respectively; calculated for C$_{16}$H$_{20}$S$_4$: 340.0448.

Synthesis of 3,4-ethylenedithio-5-n-hexyl-5'-tri-n-butylstannyl-2,2'-dithiophene having Formula (23)

In a 100 ml flask, n-butil lithium (n-BuLi) (2.5 M in hexane, 1.51 mmol, 0.6 ml) was added, dropwise, at −78° C., to a solution containing 0.43 g (1.26 mmol) of 3,4-ethylenedithio-5-n-hexyl-2,2'-dithiophene having formula (22), obtained as described above, in 40 ml of dry tetrahydrofuran (THF), under Ar atmosphere. The reaction mixture is stirred for 1 hour at −78° C. and tributyltin chloride (SnBu$_3$Cl) (0.43 ml, 1.51 mmol) was added dropwise at the same temperature. The reaction mixture was stirred at −40° C. for further 30 minutes and then allowed to warm to room temperature (25° C.). After dilution with diethyl ether (50 ml), a saturated aqueous solution of sodium fluoride (NaF) was added and the reaction mixture was stirred, for 1 hour, at room temperature (25° C.). The obtained precipitate was filtered off by using Celite® 545 and the obtained filtrate was washed with a saturated aqueous solution of sodium bicarbonate (NaHCO$_3$), then with water (3×20 ml). After drying over magnesium sulfate (MgSO$_4$), at room temperature (25° C.), for 3 hours, the solvent was evaporated at reduced pressure, obtaining 3,4-ethylenedithio-5-n-hexyl-5'-tri-n-butylstannyl-2,2'-dithiophene having formula (23), which was used in the following steps without further purification.

Said compound having formula (23) was characterized by $^1$H NMR (300 MHz, CDCl$_3$) obtaining the following spectrum: 7.35 (d, 2H), 7.10 (d, 2H), 3.24-3.22 (m, 4H), 2.72 (t, 2H), 1.64-1.51 (m, 8H), 1.41-1.25 (m, 12), 1.37-1.08 (m, 6H), 0.93-0.86 (m, 12H).

Synthesis of 5-formyl-3,3'''-dioctyl-3'''',4''''-ethylenedithio-5''''-hexyl-2,2':5',2'':5''',2''''-pentathiophene having Formula (24)

In a 100 ml flask, a mixture of 5-formyl-5''-bromo-3,3''-dioctyl-2,2':5',2''-terthiophene having formula (5) (0.21 g, 0.38 mmol), obtained as described in Example 1, 3,4-ethylenedithio-5-n-hexyl-5'-tri-n-butylstannyl-2,2'-dithiophene having formula (23) (0.3 g, 0.47 mmol), obtained as described above and tetrakis(triphenylphosphine)palladium (0) [Pd(PPh$_3$)$_4$] (44 mg, 0.038 mmol), in 50 ml of anhydrous toluene, was heated at reflux temperature of the solvent, for 12 hours. The obtained reaction mixture was cooled to room temperature (25° C.) and the solvent was evaporated at reduced pressure. The residue was dissolved in 30 ml of dichloromethane (CH$_2$Cl$_2$) and the obtained solution was washed with a 1 M aqueous solution of sodium bicarbonate (NaHCO$_3$) (2×20 ml), subsequently with water (3×10 ml) and then was dried over magnesium sulfate (MgSO$_4$), at room temperature (25° C.), for 3 hours. The solvent was subsequently evaporated at reduced pressure and the obtained residue was purified by chromatography on silica gel using dichloromethane (CH$_2$Cl$_2$) and petroleum ether (1:1, v/v) as eluent obtaining 0.15 g (50% yield) of 5-formyl- 3,3''-dioctyl-3'''',4''''-ethylenedithio-5''''-hexyl-2,2':5',2'':5'',2''':5''',2''''-pentathiophene having formula (24), as a red-orange oil, which was characterized by $^1$H NMR (300 MHz, CDCl$_3$) obtaining the following spectrum: 9.83 (s, 1H), 7.59 (s, 1H), 7.26 (d, 1H), 7.15 (d, 1H), 7.12 (d, 1H), 7.11 (d, 1H), 7.03 (s, 1H), 3.31-3.27 (m, 2H), 3.25-4.21 (m, 2H), 2.85-2.69 (m, 6H), 1.71-1.63 (m, 6H), 1.39-1.28 (m, 26), 0.89-0.85 (m, 9H).

Said compound having formula (24) was also characterized by $^{13}$C NMR (75 MHz, CDCl$_3$) obtaining the following spectrum: 182.4, 141.1, 141.0, 140.2, 140.1, 139.0, 138.1, 136.1, 135.9, 135.5, 134.7, 134.3, 128.7, 127.8, 126.5, 125.9, 125.7, 125.3, 123.9, 122.4, 122.3, 31.8, 31.5, 30.4, 30.2, 29.6, 29.4, 29.3, 29.2, 28.8, 28.5, 28.2, 27.5, 22.6, 22.5, 14.0.

Furthermore, said compound having formula (24) was also characterized by mass spectra: MS MALDI and HRMS (ESI) obtaining: [M]: 838.3 and 838.2510 (2.6 ppm), respectively; calculated for C$_{45}$H$_{58}$OS$_7$: 838.2533.

Synthesis of 5-carboxycyanovinylen-3,3''-dioctyl-3'''',4''''-ethylenedithio-5''''-hexyl-2,2':5',2'':5'',2''':5''',2''''-pentathiophene having Formula (Ie)

In a 100 ml flask, were introduced 0.10 g (0.12 mmol) of 5-formyl-3,3''-dioctyl-3'''',4''''-ethylenedithio-5''''-hexyl-2,2':5',2'':5'',2''':5''',2''''-pentathiophene having formula (24), obtained as described above, 0.020 g, (0.24 mmol) of cyanoacetic acid (NC—CH$_2$—COOH), 0.047 g (0.60 mmol) of ammonium acetate (CH$_3$COO$^-$NH$_4^+$) and 50 ml of glacial acetic acid (CH$_3$COOH) and the solution was heated at the reflux temperature of the solvent, for 12 hours. After slowly cooling the reaction mixture at room temperature (25° C.), a dark precipitate was formed which was recovered by filtration, washed with 10 ml of a diluted solution of sodium hydroxide and then with water (3×10 ml) obtaining 0.075 g (75% yield) of 5-carboxycyanovinylen-3,3''-dioctyl-3'''',4''''-ethylenedithio-5''''-hexyl-2,2':5',2'':5'',2''':5''',2''''-pentathiophene having formula (Ie), as a black solid, which was characterized by $^1$H NMR (500 MHz, THF-d$_8$) obtaining the following spectrum: 8.28 (s, 1H), 7.74 (s, 1H), 7.38 (d, 1H), 7.22 (d, 1H), 7.17 (m, 3H), 3.26-3.28 (m, 2H), 3.24-3.22 (m, 2H), 2.90-2.82 (m, 4H), 2.72 (t, 2H), 2.02-2.04 (m, 6H), 1.26-1.29 (m, 26), 0.82-0.88 (m, 9H).

Said compound having formula (Ie) was also characterized by $^{13}$C NMR (75 MHz, THF-d$_8$) obtaining the following spectrum: 204.3, 164.0, 145.7, 141.9, 141.5, 140.9, 138.7, 136.4, 136.3, 135.7, 134.9, 134.3, 132.3, 132.2, 129.4, 129.1, 129.0, 128.9, 127.3, 126.9, 126.2, 125.6, 124.6, 123.7, 123.6, 116.4, 100.2, 32.6, 32.3, 31.1, 30.9, 30.4, 30.3, 30.2, 30.1, 29.8, 29.5, 28.9, 28.6, 27.8, 25.6, 23.4, 23.2, 14.2.

Furthermore, said compound having formula (24) was also characterized by mass spectra: MS MALDI and HRMS (ESI) obtaining: [M]: 905.3 and 905.2590 (<1 ppm), respectively; calculated for C$_{48}$H$_{59}$NO$_2$S$_7$: 905.2591.

Example 6

Preparation of Dye-sensitized Solar Cell (DSSC)

Titanium dioxide (TiO$_2$) electrodes were prepared by spreading ("doctor-blade" technique) a colloidal paste containing a 20 nm sized titanium dioxide (TiO$_2$) particles (TiO$_2$ Paste DSL 18NR-T—Dyesol) on a conductive FTO glass (Hartford Glass Co., TEC 8, having a thickness of 2.3 mm and a sheet resistance of 6 Ω/cm$^2$-9 Ω/cm$^2$), previously cleaned with water and ethanol, immersed in a freshly prepared aqueous titanium tetrachloride (TiCl$_4$) solution (4.5×10$^{-2}$ M), at 70° C., for 30 minutes, and finally washed with ethanol.

After a first drying at 125° C., for 15 minutes, a reflecting scattering layer containing >100 nm sized titanium dioxide (TiO$_2$) particles (Ti-Nanoxide R/SP—Solaronix) was spread ("doctor-blade" technique) over the first titanium dioxide (TiO$_2$) layer and sintered till 500° C., for 30 minutes. The titanium dioxide (TiO$_2$) film-coated glass was cooled to room temperature (25° C.) and immersed again in a freshly prepared aqueous titanium tetrachloride (TiCl$_4$) solution (4.5×10$^{-2}$ M), at 70° C., for 30 minutes, finally washed with ethanol and sintered at 500° C., for 30 minutes, obtaining a final thickness of the electrode of 12 μm.

After sintering, the titanium dioxide (TiO$_2$) film-coated glass was cooled at about 80° C.-100° C. and immediately immersed into a dichloromethane (CH$_2$Cl$_2$) solution (5×10$^{-4}$ M) of the compound having formula (Ib), obtained as described in Example 2, at room temperature (25° C.), for 24 hours. The dyed titania-glass was washed with ethanol and dried at room temperature (25° C.), under a nitrogen (N$_2$) flux.

A 50 μm thick Surlyn spacer (TPS 065093-50—Dyesol) was used to seal the photoanode obtained as described above and the counter electrode constituted of a platinized FTO glass (Hartford Glass Co., TEC 8, having a thickness of 2.3 mm and a sheet resistance of 6 Ω/cm$^2$-9 Ω/cm$^2$), subsequently the cell was filled up with the electrolyte solution having the following composition: N-methyl-N-butylimidazolium iodide (0.6 M), iodine (0.04 M), lithium iodide (LiI) (0.025 M), guanidinium-thiocyanate (0.05 M) and t-butylpyridine (0.28 M), in a 15:85 (v/v) mixture of valeronitrile and acetonitrile.

The active area of the cell, calculated by means of a microphotography, was 0.1225 cm$^2$.

The photovoltaic performance of the cell was measured with a solar simulator (Abet 2000) equipped with a 300 W Xenon light source, the light intensity was adjusted with a standard calibrated Si solar cell ("VLSI Standard" SRC-1000-RTD-KGS), the current-voltage characteristics were acquired by applying an external voltage to the cell and measuring the generated photocurrent with a "Keithley 2602A" (3 A DC, 10 A Pulse) digital source meter. The following results were obtained:

Voc (open circuit photovoltage)=655 mV;
FF (fill factor)=70.3%;
Jsc (short-circuit photocurrent density)=17.99 mA/cm$^2$;
η (photoelectric transformation efficiency)=8.28%.

Example 7

Preparation of Dye-sensitized Solar Cell (DSSC)

With the same procedure described in Example 6, a dye-sensitized solar cell (DSSC) was prepared by using an organic dye of formula (Ib) obtained as described in Example 2, and employing a commercial electrolyte solution [EL-HPE (High Performance Electrolyte) from Dyesol]. In this case the active area of the cell, calculated by means of a microphotography, was 0.1211 cm$^2$. The photovoltaic performance of the cell was measured as described in Example 6. The following results were obtained:

Voc (open circuit photovoltage)=638 mV;
FF (fill factor)=67.9%;
Jsc (short-circuit photocurrent density)=21.09 mA/cm$^2$;
η (photoelectric transformation efficiency)=9.14%.

Example 8

Preparation of Dye-sensitized Solar Cell (DSSC)

With the same procedure described in Example 6, a dye-sensitized solar cell (DSSC) was prepared by using an organic dye of formula (Ib) obtained as described in Example 5. In this case the active area of the cell, calculated by means of a microphotography, was 0.1254 cm². The photovoltaic performance of the cell was measured as described in Example 6. The following results were obtained:

Voc (open circuit photovoltage)=690 mV;
FF (fill factor)=69.2%;
Jsc (short-circuit photocurrent density)=18.22 mA/cm²;
η (photoelectric transformation efficiency)=8.69%.

The invention claimed is:

1. An organic dye having formula (I):

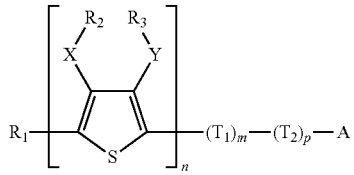
(I)

wherein:
$T_1$ is a thiophenyl group of formula (II):

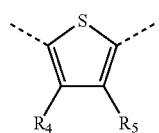
(II)

wherein $R_4$ and $R_5$ equal to or different from each other, represent a hydrogen atom; or are selected from $C_1$-$C_{20}$ alkyl, linear or branched, saturated or unsaturated;

$T_2$ is a 2,2':5',2''-terthiophenyl group of formula (IV):

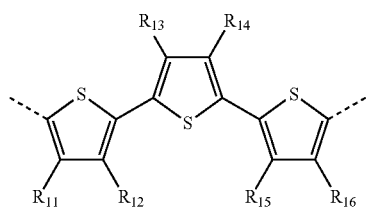
(IV)

wherein $R_{11}$, $R_{13}$, $R_{14}$ and $R_{16}$, equal to or different from each other, represent a hydrogen atom; or are selected from $C_1$-$C_{20}$ alkyl, linear or branched, saturated or unsaturated; $R_{12}$ and $R_{15}$, equal to or different from each other, are selected from $C_1$-$C_{20}$ alkyl, linear or branched, saturated or unsaturated;

$R_1$ is a hydrogen atom; or is selected from $C_1$-$C_{20}$ alkyl groups, linear or branched, saturated or unsaturated;

$R_2$ and $R_3$ are bound to each other to form, together with the other atoms to which they are bound, a saturated cycle containing 4 carbon atoms and two heteroatoms;

A is a carboxycyanovinylene group having formula (V):

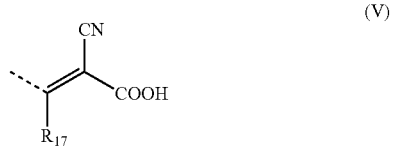
(V)

wherein $R_{17}$ represents a hydrogen atom;
X and Y, equal to or different from each other, represent oxygen or sulphur;
n is 1;
m is 0 or 1;
p is 0 or 1; and
m+p is 1 or 2.

2. The organic dye according to claim 1, wherein $R_4$ and $R_5$ represent a hydrogen atom.

3. The organic dye according to claim 1, wherein $R_{11}$, $R_{13}$, $R_{14}$, and $R_{16}$ represent a hydrogen atom.

4. The organic dye according to claim 1, wherein $R_{12}$ and $R_{15}$ are a n-hexyl group.

5. The organic dye according to claim 1, wherein $R_1$ is a hydrogen atom or a n-hexyl group.

6. The organic dye according to claim 1, wherein $R_2$ and $R_3$ are bound to each other to form, together with the other atoms to which they are bound, a saturated cycle containing 4 carbon atoms and two heteroatoms, said heteroatoms being oxygen or sulphur.

7. The organic dye according to claim 1, wherein the dye is free of metal.

8. A dye-sensitized photoelectric transformation element comprising at least one organic dye having formula (I) according to claim 1, said dye-sensitized photoelectric transformation element being supported on oxide semiconductor particles.

9. A dye-sensitized solar cell comprising the dye-sensitized photoelectric transformation element according to claim 8.

10. The dye-sensitized solar cell according to claim 9, wherein a photoelectric transformation efficiency (η) of the dye-sensitized solar cell is greater than or equal to 7.5%.

* * * * *